United States Patent
Bozorg et al.

(10) Patent No.: US 11,190,167 B2
(45) Date of Patent: Nov. 30, 2021

(54) DISCRETE TIME CHARGE SHARING IIR BANDPASS FILTER INCORPORATING CLOCK PHASE REUSE

(71) Applicant: University College Dublin, Dublin (IE)

(72) Inventors: Amirhossein Ansari Bozorg, Dublin (IE); Robert Bogdan Staszewski, Dublin (IE)

(73) Assignee: UNIVERSITY COLLEGE DUBLIN, Dublin (IE)

( * ) Notice: Subject to any disclaimer, the term of this patent is extended or adjusted under 35 U.S.C. 154(b) by 392 days.

(21) Appl. No.: 16/251,227

(22) Filed: Jan. 18, 2019

(65) Prior Publication Data

US 2019/0229707 A1    Jul. 25, 2019

Related U.S. Application Data

(60) Provisional application No. 62/619,815, filed on Jan. 21, 2018.

(51) Int. Cl.
*H03H 17/02* (2006.01)
*H04B 1/16* (2006.01)
(Continued)

(52) U.S. Cl.
CPC ........ *H03H 17/0255* (2013.01); *H03H 15/00* (2013.01); *H03H 19/004* (2013.01);
(Continued)

(58) Field of Classification Search
CPC .. H03H 17/0255; H03H 15/00; H03H 19/004; H03H 2017/009; H04B 1/08; H04B 1/16
See application file for complete search history.

(56) References Cited

U.S. PATENT DOCUMENTS

| | | | |
|---|---|---|---|
| 9,148,125 B2 * | 9/2015 | Tohidian | H03D 3/007 |
| 2014/0080436 A1 * | 3/2014 | Madadi | H03B 1/00 |
| | | | 455/307 |
| 2017/0170810 A1 * | 6/2017 | Madadi | H03H 15/00 |

OTHER PUBLICATIONS

Sameed Hameed, et al., A Time-Interleaved Filtering-by-Aliasing Receiver Front-End with >70dB Suppression at <4xBandwidth Frequency Offset, 2017 IEEE International Solid-State Circuits Conference, Session 24, Wireless Receivers and Synthesizers, 24.6, pp. 418-420, Feb. 8, 2017.

(Continued)

*Primary Examiner* — Nguyen T Vo
(74) *Attorney, Agent, or Firm* — Zaretsky Group PC; Howard Zaretsky

(57) ABSTRACT

A novel and useful discrete time IIR bandpass filter is disclosed that takes advantage of clock phase reuse thereby leading to significant improvements in filtering, especially stop band rejection in comparison to prior art filters. The bandpass filter of the present invention achieves improved filtering performance without adding any additional clock phases to the circuit. In particular, reuse of the already existing clock phases increases the order and performance of the filter. The invention exploits reuse of the clock phases to provide higher order filtering along with a discrete time IIR filter design which is capable of operating at high frequency. Consequently, much better filtering is achieved and the quality factor of the filter is improved leading to sharper transition bands especially for close-in band blockers in modern 4G/5G receivers.

16 Claims, 16 Drawing Sheets

(51) Int. Cl.
  H04B 1/08    (2006.01)
  H03H 15/00   (2006.01)
  H03H 19/00   (2006.01)
  H03H 17/00   (2006.01)
(52) U.S. Cl.
  CPC ............... *H04B 1/08* (2013.01); *H04B 1/16* (2013.01); *H03H 2017/009* (2013.01)

(56) References Cited

OTHER PUBLICATIONS

Iman Madadi, et al., Analysis and Design of I/Q Charge-Sharing Band-Pass-Filter for Superheterodyne Receivers, IEEE Transactions on Circuits and Systems—I: Regular Papers, vol. 62, No. 8, pp. 2114-2121, Aug. 2015.
A. Mirzaei, et al., A Second-Order Anti-aliasing Prefilter for an SDR Receiver, IEEE 2005 Custom Integrated Circuits Conference, pp. 629-632, 2005.
Mostafa Savadi Oskooei, et al., A CMOS 4.35-mW +22-dBm IIP3 Continuously Tunable Channel Select Filter for WLAN/WiMAX Receivers, IEEE Journal of Solid-State Circuits, vol. 46, No. 6, pp. 1382-1391, Jun. 2011.
Massoud Tohidian, et al., A 2mW 800MS/s 7th-Order Discrete-Time IIR Filter with 400kHz-to-30MHz BW and 100dB Stop-Band Rejection in 65nm CMOS, 2013 IEEE International Solid-State Circuits Conference, Session 10, Analog Techniques, 10.2, pp. 174-176, Feb. 19, 2013.
Yang Xu, et al., A Switched-Capacitor RF Front End With Embedded Programmable High-Order Filtering, IEEE Journal of Solid-State Circuits, vol. 51, No. 5, pp. 154-1167, May 2016.
Yang Xu, et al., A 7.5mW 35-70MHz 4th-Order Semi-Passive Charge-Sharing Band-Pass Filter with Programmable Bandwidth and 72dB Stop-Band Rejection in 65nm CMOS, 2016 IEEE Radio Frequency Integrated Circuits Symposium, pp. 162-165, 2016.
Yijun Zhou, et al., An 8-Bit 100-MHz CMOS Linear Interpolation DAC, IEEE Journal of Solid-State Circuits, vol. 38, No. 10, pp. 1758-1761, Oct. 2003.
Amir Bozorg, et al., A 0.02-4.5-GHz LN(T)A in 28-nm CMOS for 5G Exploiting Noise Reduction and Current Reuse, IEEE Journal of Solid-State Circuits, Sep. 4, 2020.
Milad Darvishi, et al., Design of Active N-Path Filters, IEEE Journal of Solid-State Circuits, vol. 48, No. 12, pp. 2962-2976, Dec. 2013.
Ivan Fabiano, et al., SAW-Less Analog Front-End Receivers for TDD and FDD, IEEE Journal of Solid-State Circuits, vol. 48, No. 12, pp. 3067-3079, Dec. 2013.
Sandro Binsfeld Ferreira, et al., System Design of a 2.75-mW Discrete-Time Superheterodyne Receiver for Bluetooth Low Energy, IEEE Transactions on Microwave Theory and Techniques, vol. 65, No. 5, pp. 1904-1913, May 2017.
Arnd Geis, et al., A 0.5 mm Power-Scalable 0.5-3.8-GHz CMOS DT-SDR Receiver With Second-Order RF Band-Pass Sampler, IEEE Journal of Solid-State Circuits, vol. 45, No. 11, pp. 2375-2387, Nov. 2010.
Amir Ghaffari, et al., Tunable High-Q N-Path Band-Pass Filters: Modeling and Verification, IEEE Journal of Solid-State Circuits, vol. 46, No. 5, pp. 998-1010, May 2011.

Daniel Kaczman, et al., A Single-Chip 10-Band WCDMA/HSDPA 4-Band GSM/EDGE SAW-less CMOS Receiver With DigRF 3G Interface and 90 dBm IIP2, IEEE Journal of Solid-State Circuits, vol. 44, No. 3, pp. 718-739, Mar. 2009.
Feng-Wei Kuo, et al., A Bluetooth Low-Energy Transceiver With 3.7-mW All-Digital Transmitter, 2.75-mW High-IF Discrete-Time Receiver, and TX/RX Switchable On-Chip Matching Network, IEEE Journal of Solid-State Circuits, vol. 52, No. 4, pp. 1144-1162, Apr. 2017.
Barend van Liempd, et al., A 0.9 V 0.4—6 GHz Harmonic Recombination SDR Receiver in 28 nm CMOS With HR3/HR5 and IIP2 Calibration, IEEE Journal of Solid-State Circuits, vol. 49, No. 8, pp. 1815-1826, Aug. 2014.
Iman Madadi, et al., A High IIP2 SAW-Less Superheterodyne Receiver With Multistage Harmonic Rejection, IEEE Journal of Solid-State Circuits, vol. 51, No. 2, pp. 332-347, Feb. 2016.
Ahmad Mirzaei, et al., Analysis and Optimization of Current-Driven Passive Mixers in Narrowband Direct-Conversion Receivers, IEEE Journal of Solid-State Circuits, vol. 44, No. 10, pp. 2678-2688, Oct. 2009.
Ahmad Mirzaei, et al., A Low-Power Process-Scalable Super-Heterodyne Receiver With Integrated High-Q Filters, IEEE Journal of Solid-State Circuits, vol. 46, No. 12, pp. 2920-2932, Dec. 2011.
David Murphy, et al., A Blocker-Tolerant Wideband Noise-Cancelling Receiver with a 2dB Noise Figure, 2012 IEEE International Solid-State Circuits Conference, Session 4, RF Techniques, 4.1, pp. 74-76, Feb. 20, 2012.
David Murphy, et al., A Noise-Cancelling Receiver Resilient to Large Harmonic Blockers, IEEE Journal of Solid-State Circuits, vol. 50, No. 6, pp. 1336-1350, Jun. 2015.
Zhiyu Ru, et al., Discrete-Time Mixing Receiver Architecture for RF-Sampling Software-Defined Radio, IEEE Journal of Solid-State Circuits, vol. 45, No. 9, pp. 1732-1745, Sep. 2010.
Bart J. Thijssen, et al., Low-Power Highly Selective Channel Filtering Using a Transconductor—Capacitor Analog FIR, IEEE Journal of Solid-State Circuits, vol. 55, No. 7, pp. 1785-1795, Jul. 2020.
Massoud Tohidian, et al., A Fully Integrated Highly Reconfigurable Discrete-, Time Super-Heterodyne Receiver, 2014 IEEE International Solid-State Circuits Conference, Session 3, RF Techniques, 3.8, pp. 72-74, Feb. 10, 2014.
Massoud Tohidian, et al., Analysis and Design of a High-Order Discrete-Time Passive IIR Low-Pass Filter, IEEE Journal of Solid-State Circuits, vol. 49, No. 11, pp. 2575-2587, Nov. 2014.
Massoud Tohidian, et al., A Fully Integrated Discrete-Time Superheterodyne Receiver, IEEE Transactions on Very Large Scale Integration (VLSI) Systems, vol. 25, No. 2, pp. 635-647, Feb. 2017.
Hao Wu, et al., A Harmonic-Selective Multi-Band Wireless Receiver With Digital Harmonic Rejection Calibration, IEEE Journal of Solid-State Circuits, vol. 54, No. 3, pp. 796-807, Mar. 2019.
Yang Xu, et al., A Charge-Domain Switched-Gm-C Band-Pass Filter Using Interleaved Semi-Passive Charge-Sharing Technique, IEEE Transactions on Circuits and Systems—I: Regular Papers, vol. 67, No. 2, pp. 600-610, Feb. 2020.
Heng Zhang et al., Linearization Techniques for CMOS Low Noise Amplifiers: A Tutorial, IEEE Transactions on Circuits and Systems—I: Regular Papers, vol. 58, No. 1, pp. 22-36, Jan. 2011.

* cited by examiner

DISCRETE TIME CHARGE SHARING IIR BANDPASS FILTER INCORPORATING CLOCK PHASE REUSE

REFERENCE TO PRIORITY APPLICATION

This application claims priority to U.S. Provisional Application Ser. No. 62/619,815, filed Jan. 21, 2018, entitled "Discrete Time IIR Bandpass Filter With Improved Filtering And Clock Phase Reuse Technique," incorporated herein by reference in its entirety.

FIELD OF THE INVENTION

The present invention relates to the field of semiconductor integrated circuits and more particularly relates to discrete time infinite impulse response (IIR) bandpass filter (BPF) having improved filtering and incorporating a clock phase reuse technique.

BACKGROUND OF THE INVENTION

In prior art discrete time IIR filtering, which can operate in either voltage mode or current mode, one way to improve filtering performance is to increase the order of filtering. This can be achieved only by increasing the number of phases leading to a reduction in the duty cycle of clock generator. Although adding more phases to the IIR filter improves the filtering, in wideband applications, when the clock frequency is high, it is often not practical to increase the number of phases. This is mainly limited by both the technology and the clock generator for providing the required duty cycle with acceptable rise and fall edge timing.

Monolithic RF communications receivers typically use a zero/low intermediate frequency (IF) due to straightforward silicon integration of low pass channel select filtering and avoidance of images (when zero-IF) or their easy baseband filtering (when low-IF). Their disadvantage, however, such as poor $2^{nd}$ order nonlinearity, sensitivity to 1/f (i.e. flicker) noise and time variant dc offsets, are all getting more severe with CMOS scaling. These problems could be solved, however, by increasing the IF frequency, as was the norm in the pre-IC era with superheterodyne radios. To avoid the interferers and blockers at IF images, however, high quality Q factor bandpass filtering (BPF) is required, which is currently extremely difficult to implement in CMOS using continuous time circuitry.

There is thus a need for a discrete time IIR filter, including a bandpass filter, having improved filtering capability that does not suffer from the disadvantages of the prior art. The improved IIR filter preferably should not require an increase in the number of clock phases required as with prior art filters. In addition, the improved filter should not suffer from a reduction in duty cycle of the clock generator.

SUMMARY OF THE INVENTION

A novel and useful discrete time IIR bandpass filter is disclosed that takes advantage of reusing existing clock phases thereby leading to significant improvements in filtering, especially stop band rejection in comparison to prior art filters. The bandpass filter of the present invention achieves improved filtering performance without adding any additional clock phases to the circuit. In particular, reuse of the already existing clock phases increases the order of the filter. The invention exploits reuse of the clock phases to provide higher order filtering along with a discrete time IIR filter design which is capable of running at high frequency. Consequently, much better filtering is achieved and the quality factor of the filter is improved, which leads to sharper transition bands especially for close-in band blockers in 4G/5G receivers.

Being able to be operate at high clock frequencies, high stop band rejection, and having bandwidth tunability makes the filter architecture of the present invention amenable to be used in discrete time receivers. Such receivers are typically difficult to design for applications such as 5G and phased array for automotive radar, since applications such as these require relatively high performance filtering with high frequency clocks for generating multiple phases.

Furthermore, to help meet the increased demand for highly integrated BPFs that are free from any replicas and still compatible with CMOS scaling suitable for superheterodyne receivers, the present invention provides a full rate charge sharing (CS) discrete time (DT) operation that is practically free from replicas and which offers the ability to change the IF frequency in the case of large blockers, thereby avoiding desensitization.

The present invention provides a high IF discrete time BPF filter capable of realizing a fully integrated RF receiver, e.g., homodyne, superheterodyne, etc. The filter exploits passive switched capacitor techniques, is amenable to CMOS scaling, and is very robust to mismatches. Its center frequency and bandwidth are well controlled via clock frequency and capacitor ratios.

A high-IF superheterodyne receiver incorporating the high-Q complex discrete time charge sharing BPF of the present invention offers superior filtering at RF frequencies (i.e. rejection of image folding) in addition to strong filtering of the image components while achieving low power consumption in a very small chip area. The technique of impedance combination is utilized to realize a complex high-Q RF band pass filter that rejects image folding that facilitates the broader adoption of high-IF receiver architectures.

In an example implementation of the circuit architecture of the present invention, by reusing the existing clock phases, for the same total occupied silicon area assuming same capacitor density in comparison with prior art architectures, the out of band rejection is improved by more than 10 dB for close band offset (i.e. less than 15 MHz).

There is thus provided in accordance with the invention, a discrete time bandpass filter, comprising a quadrature input node for receiving a complex input signal, a plurality of first switched history capacitors ($C_{H1}$), each first switched history capacitor associated with a different portion of the quadrature input node, a sharing capacitor ($C_S$) coupled to the plurality of first switched history capacitors and operative to cyclically share charge therewith, a plurality of output capacitor arrays, each output capacitor array coupled to the sharing capacitor and including one or more second switched history capacitors, and a clock generator operative to generate multiple clock phases, wherein during each multi-phase cycle of the filter, each first switched history capacitor is individually connected to the sharing capacitor such that only a single first switched history capacitor is connected to the sharing capacitor during each phase.

There is also provided in accordance with the invention, a discrete time bandpass filter, comprising a quadrature input node for receiving a complex input signal, a plurality of first switched history capacitors ($C_{H1}$), each first switched history capacitor associated with a different element of the quadrature input node, a sharing capacitor ($C_S$) coupled to the plurality of first switched history capacitors and operative to cyclically share charge therewith, a plurality of capacitor arrays, each output capacitor array coupled to the sharing capacitor and including one or more second switched history capacitors, a clock generator operative to generate a plurality of clock phases, wherein during each multi-phase cycle of the filter a single first switched history capacitor is connected to the sharing capacitor, charge is shared from at least one second switched history capacitor to a neighboring second switched history capacitor in each capacitor array, each clock phase is reused being coupled to a plurality of second switched history capacitors, and wherein charge is shared between neighboring second switched history capacitors within each capacitor array in a predetermined sequence to generate a quadrature output thereby.

There is further provided in accordance with the invention, a discrete time bandpass filter method, the method comprising receiving a complex input signal, providing a plurality of first switched history capacitors ($C_{H1}$), each first switched history capacitor associated with a different element of the quadrature input node, cyclically sharing charge between a sharing capacitor ($C_S$) and the plurality of first switched history capacitors, providing a plurality of capacitor arrays, each output capacitor array coupled to the sharing capacitor and including one or more second switched history capacitors, generating a plurality of clock phases, wherein during each multi-phase cycle of the filter connecting one of the single first switched history capacitors to the sharing capacitor, sharing charge between at least one second switched history capacitor and a neighboring second switched history capacitor in each capacitor array, reusing each clock phase one or more times, each clock phase coupled to a plurality of second switched history capacitors, and sharing charge between neighboring second switched history capacitors within each capacitor array in a predetermined sequence to generate a quadrature output thereby.

There is also provided in accordance with the invention, a radio frequency (RF) receiver, comprising an RF input node for receiving an RF input signal, a local oscillator (LO) input node for receiving an LO signal, a mixer coupled to the RF input node and the LO input node, the mixer operative to frequency translate the RF input signal in accordance with the LO signal, the mixer producing an in-phase/quadrature (I/Q) intermediate frequency (IF) signal of frequency substantially higher than a bandwidth of the RF input signal, a discrete-time (DT) charge sharing (CS) IF bandpass filter coupled to the IF signal, wherein the bandpass filter comprises a plurality of first switched history capacitors ($C_{H1}$), each first switched history capacitor associated with a different element of a quadrature input node, a sharing capacitor ($C_S$) coupled to the plurality of first switched history capacitors and operative to cyclically share charge therewith, a plurality of capacitor arrays, each output capacitor array coupled to a respective first switched history capacitor and including one or more second switched history capacitors, a clock generator operative to generate a plurality of clock phases, wherein during each multi-phase cycle of the filter a single first switched history capacitor is connected to the sharing capacitor, charge is shared from at least one second switched history capacitor to a neighboring second switched history capacitor in each capacitor array, each clock phase is reused by being coupled to a plurality of second switched history capacitors, and wherein charge is shared between neighboring second switched history capacitors within each capacitor array in a predetermined sequence to generate a quadrature output thereby.

BRIEF DESCRIPTION OF THE DRAWINGS

The invention is herein described, by way of example only, with reference to the accompanying drawings, wherein.

DETAILED DESCRIPTION OF THE INVENTION

The present invention is a novel and useful discrete time (DT) charge sharing (CS) infinite impulse response (IIR)

bandpass filter that exploits the reuse of existing clock phases. This yields significant improvements in filtering performance, especially stop band rejection in comparison to prior art filters. The bandpass filter achieves improved filtering performance while not requiring the addition of any clock phases to the circuit. In particular, reuse of the already existing clock phases provides the increase in the order of the filter. The invention exploits clock phase reuse to provide higher order filtering along with a discrete time IIR filter design which is capable of running at relatively high frequencies.

An RF receiver, e.g., high-IF superheterodyne receiver, incorporating the high-Q complex discrete time charge sharing BPF of the present invention offers superior filtering at RF frequencies (i.e. rejection of image folding) in addition to strong filtering of the image components while achieving low power consumption in a very small chip area. The technique of impedance combination is utilized to realize a complex high-Q RF band pass filter that rejects image folding that facilitates the broader adoption of high-IF receiver architectures.

Figure 1:
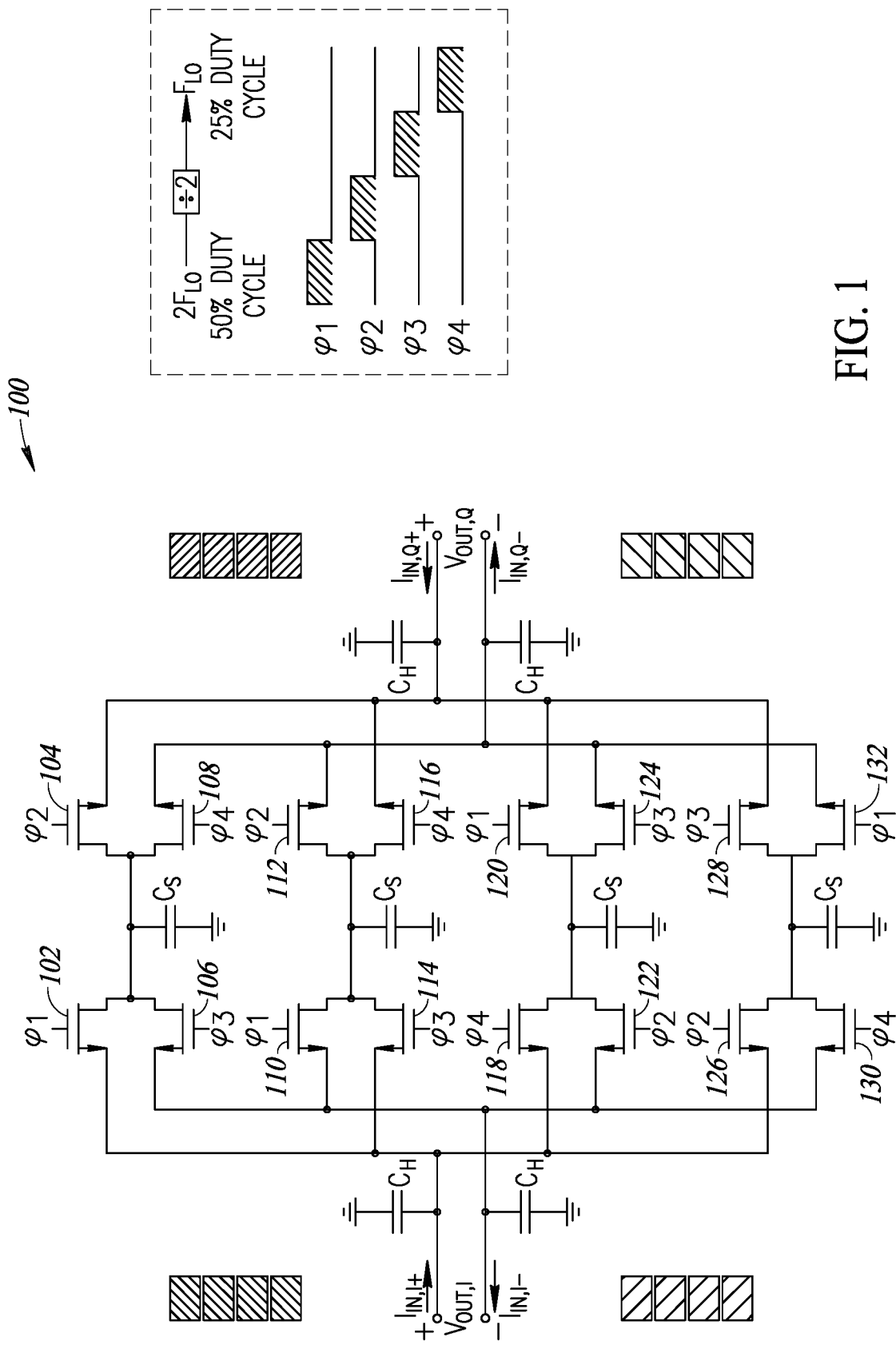
FIG. 1 is a schematic diagram illustrating an initial state of charge sharing between history and rotating capacitors in an example IQ charge sharing BPF.
Figure 2:
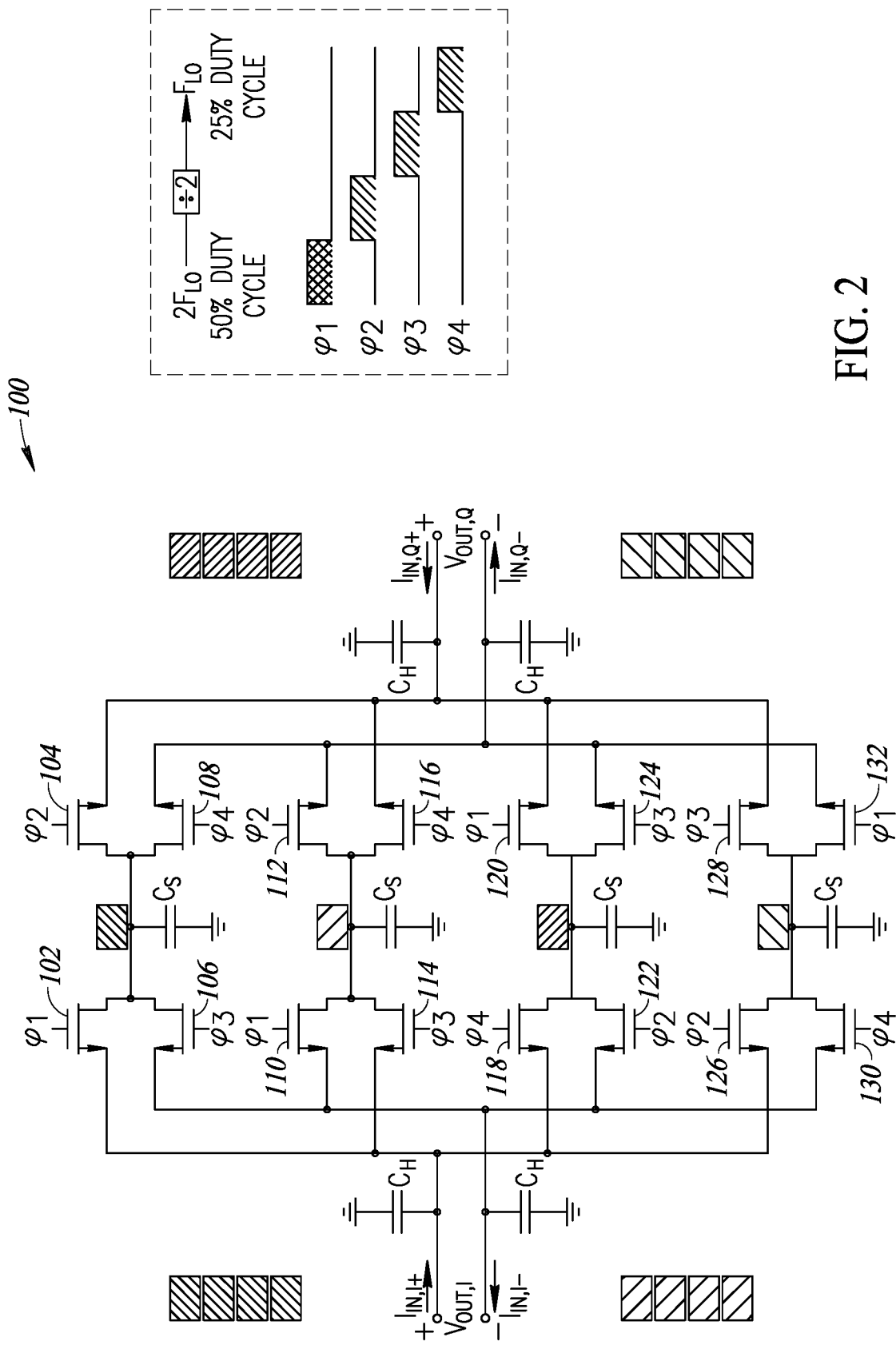
FIG. 2 is a schematic diagram illustrating a first state of charge sharing between history and rotating capacitors in the example IQ charge sharing BPF.
Figure 3:
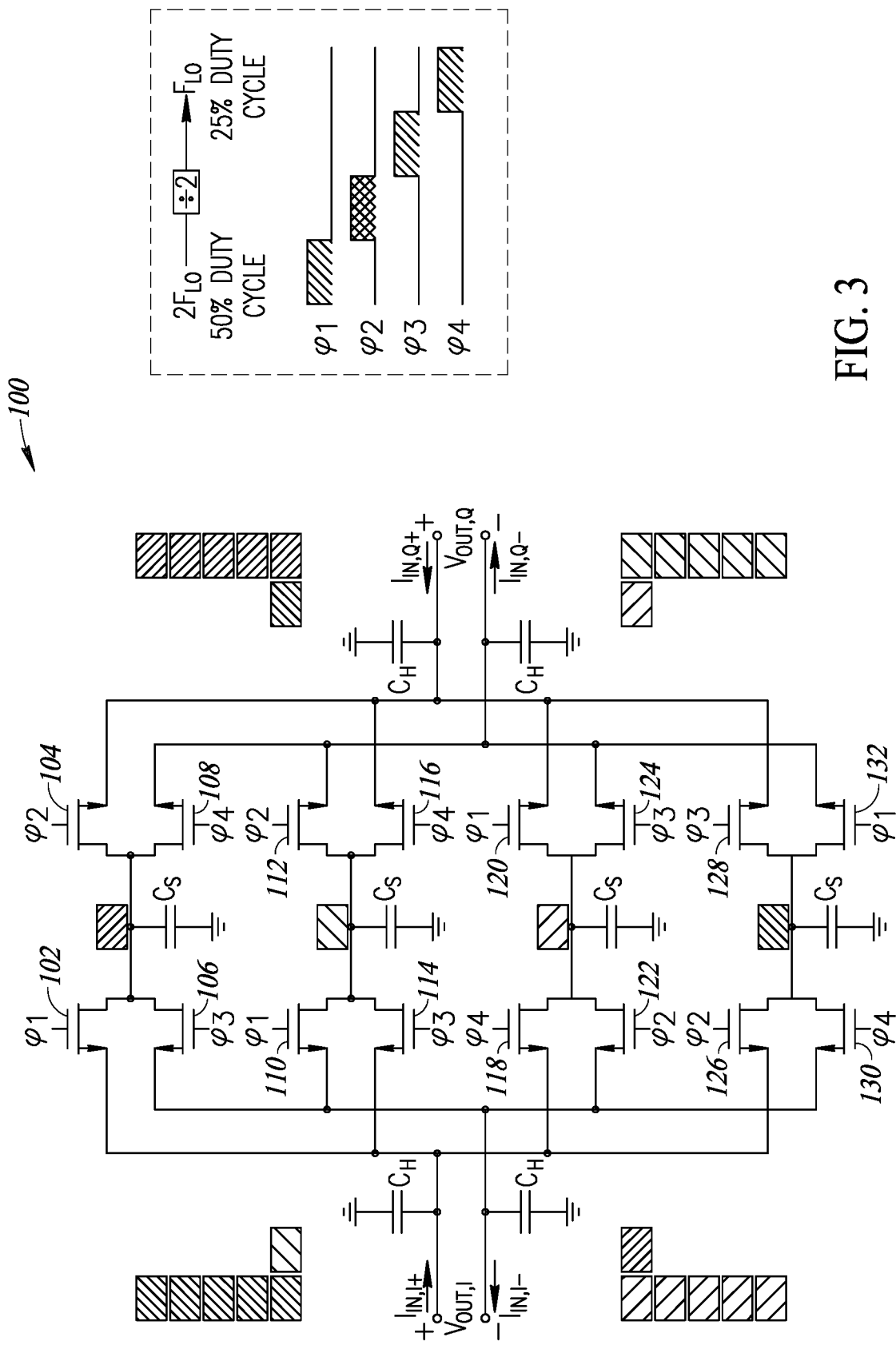
FIG. 3 is a schematic diagram illustrating a second state of charge sharing between history and rotating capacitors in the example IQ charge sharing BPF.
Figure 4:
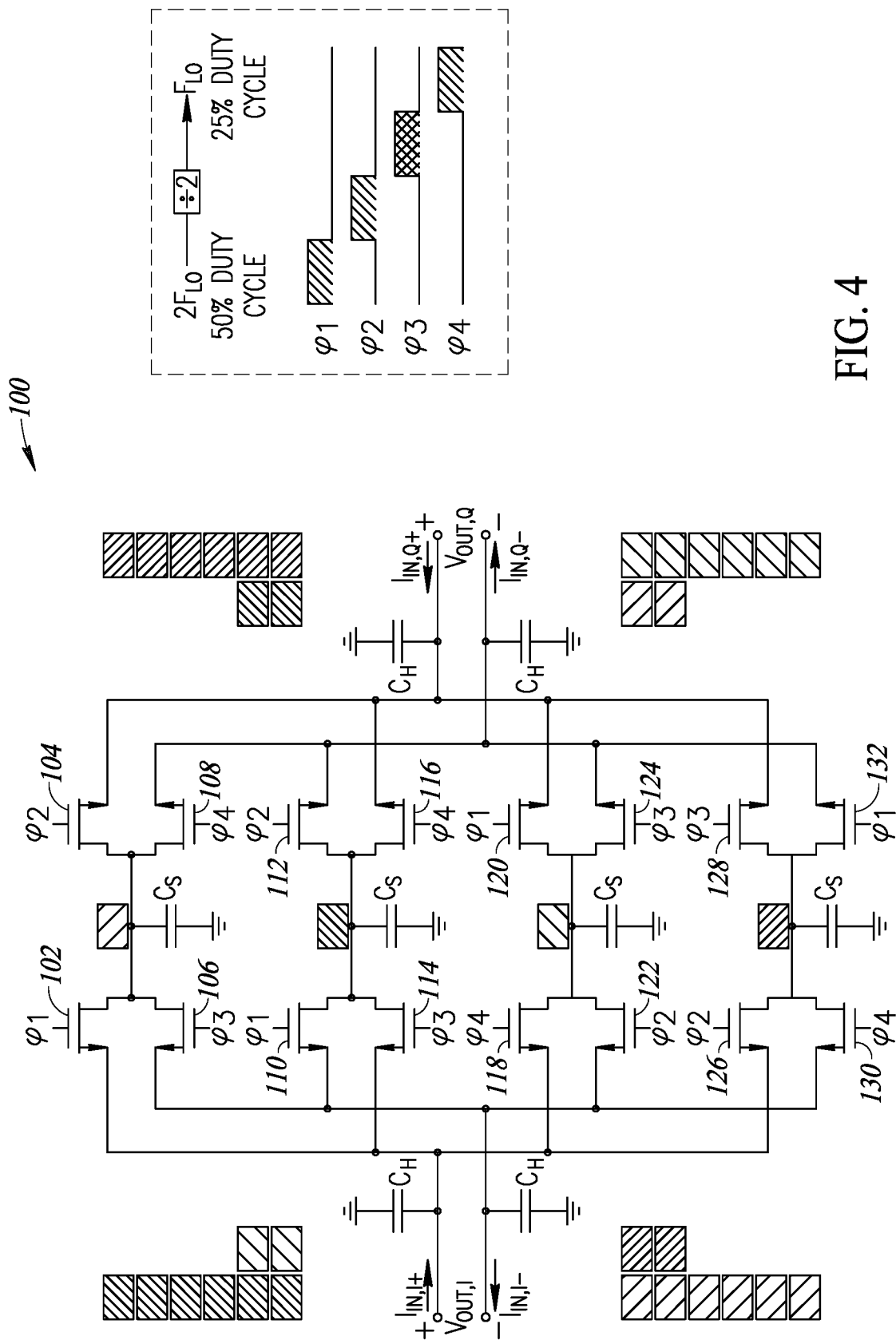
FIG. 4 is a schematic diagram illustrating a third state of charge sharing between history and rotating capacitors in the example IQ charge sharing BPF.
Figure 5:
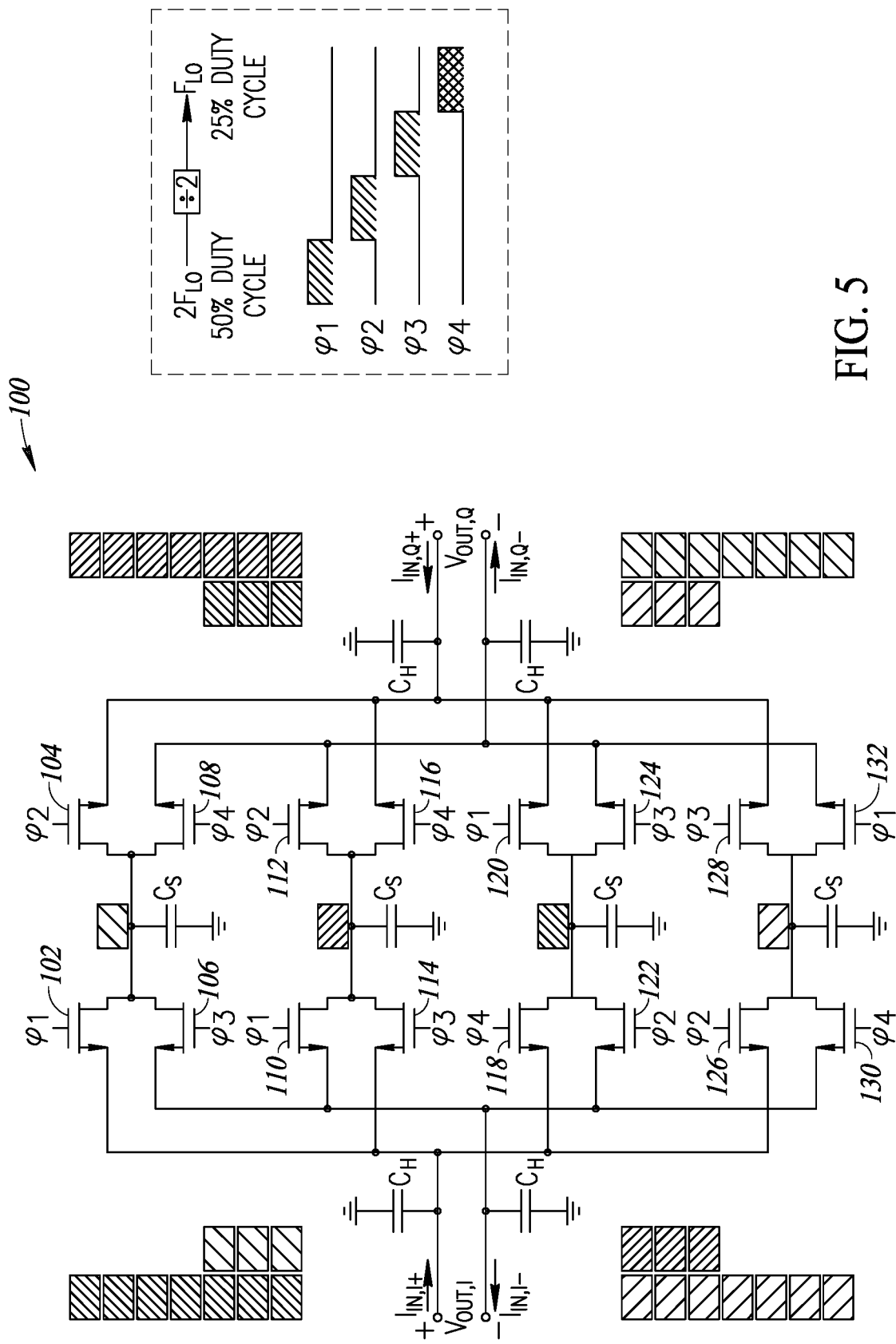
FIG. 5 is a schematic diagram illustrating a fourth state of charge sharing between history and rotating capacitors in the example IQ charge sharing BPF.

A schematic diagram illustrating an initial state of charge sharing between history and rotating capacitors in an example IQ charge sharing BPF is shown in FIG. 1. The bandpass filter, generally referenced 100, comprises history capacitors $C_H$, sharing capacitors $C_S$ (also referred to as rotating capacitors), phase 1 transistors 102, 110, 120, 128, phase 2 transistors 104, 112, 122, 126, phase 3 transistors 106, 114, 124, 128, and phase 4 transistors 108, 116, 118, 130. A schematic diagram illustrating a first state of charge sharing between history and rotating capacitors in the example IQ charge sharing BPF is shown in FIG. 2. A schematic diagram illustrating a second state of charge sharing between history and rotating capacitors in the example IQ charge sharing BPF is shown in FIG. 3. A schematic diagram illustrating a third state of charge sharing between history and rotating capacitors in the example IQ charge sharing BPF is shown in FIG. 4. A schematic diagram illustrating a fourth state of charge sharing between history and rotating capacitors in the example IQ charge sharing BPF is shown in FIG. 5.

FIGS. 1, 2, 3, 4, and 5 illustrate the concept of charge sharing bandpass filtering. The input current $I_{in,I+}$, $I_{in,I-}$, $I_{in,Q+}$, $I_{in,Q-}$ is integrated into the total capacitor $C_t=C_H+C_S$ during four phases of the non-overlapping 25% full-rate local oscillator (LO) clock. The full-rate operation means that it works at the maximum sampling frequency of $4f_{LO}$ to avoid decimation. The main drawback of an early decimation would be an unwanted folding due to the change of the sampling rate between stages. Therefore, in order to avoid aliasing, the sampling frequency is maintained at full rate. After each integration of the current into $C_t$ of each quadrature path, a small portion of the total charge $$\frac{C_S}{C_t} Q_{in}$$

is shared between the real and imaginary paths in the next clock cycle. This operation forms a complex filter with a transfer function given by $$H(z) = \frac{vout(z)}{Qin(z)} = \frac{k}{1-(a+jb)z^{-1}} \quad (1)$$

where $k=1/(C_H+C_S)$, $a=C_H/(C_H+C_S)$ and $b=C_S/(C_H+C_S)$. In accordance with Equation 1, the charge-sharing process forms a 1st-order complex filter centered at $$f_c = \frac{f_s}{2\pi}\arctan\frac{b}{a} \quad (2)$$

Therefore, it is possible to adjust the center frequency $f_c$ by changing the coefficients a and b. It is not possible, however, to make the filter very sharp because the discrete time charge sharing is a lossy operation which increases bandwidth of the filter. $f_c$ is slightly sensitive to the capacitance ratio mismatch, as compared with the N-path filter, in which the center frequency is exactly equal to the operating clock frequency. A key advantage of this structure is that the IQ charge sharing BPF has very robust filtering at frequencies located at $f_s=2$. As a result, it is feasible to use this structure as the BPF centered at $f_{IF}$ to reject image signals located at harmonics of $f_{IF}$. Another benefit of using this filter is that its sampling frequency is equal to $f_s=4f_{LO}$. Therefore, no unwanted image folding occurs as compared to the N-path filter, which suffers from harmonics folding.

The filter architecture as well as applications to RF receivers described herein offers several advantages over the prior art. The high-IF receiver utilizing the discrete time charge sharing BPF of the present invention eliminates prior art homodyne receiver disadvantages, such as LO feedthorough, dc offset, 1/f noise and $2^{nd}$-order nonlinearity, which force all active devices to be very large. In one embodiment, the gain blocks comprise simple inverter-based $g_m$ stages. All switches and capacitors used in the filters are amenable to CMOS technology scaling. In addition, the high-Q BPF of the present invention has superior image rejection as compared to the N-path filter. In mixer based BPFs, such as the N-path filter, the rejection of the image components is ultimately limited by the mismatch between the LO clock of I and Q paths. On the other hand, there is no inherent limitation in the receiver of the present invention on the level of image component rejection other than the noise figure (NF) degradation and power consumption of LO distribution.

Figure 6:
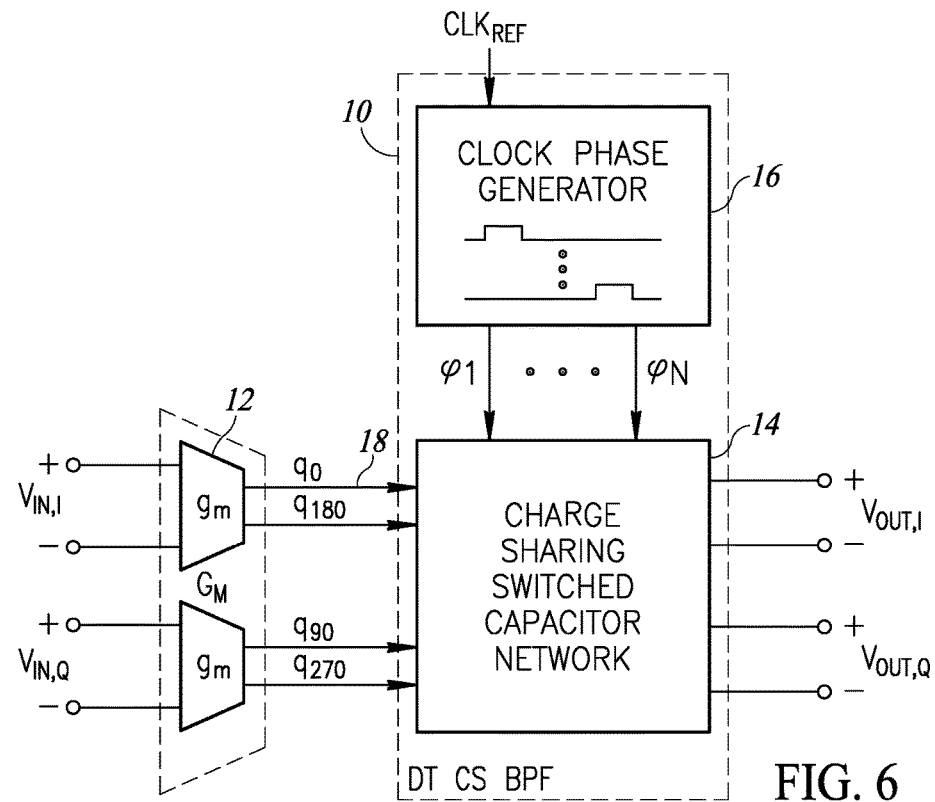
FIG. 6 is a high level block diagram illustrating an example discrete time IIR charge sharing filter of the present invention.

A high level block diagram illustrating an example discrete time (DT) charge sharing (CS) IIR bandpass filter (BPF) of the present invention is shown in FIG. 6. The BPF, generally referenced 10, comprises a charge sharing switched capacitor network 14 and a clock phase generator 16 operative to generate four clock phases. A $G_m$-cell block 13 comprising one or more $g_m$-cells 12 is used to convert voltage inputs to current inputs as needed by the switched capacitor network 14.

In one embodiment, the differential I input signal $V_{IN\_I}{}^+$, $V_{IN\_I}{}^-$ is input to a $g_m$-cell which functions to generate q0 and q180 signals. Similarly, differential Q input signal $V_{IN\_Q}{}^+$, $V_{IN\_Q}{}^-$ is input to a $g_m$-cell which functions to generate q90 and q270 signals. The clock phase generator 16 receives a reference clock $CLK_{REF}$ and in accordance therewith, functions to generate the 4 multiple clock phases φ1 through φ4. In response to the multi-phase clock signals and q0, q180, q90, q270 signals, the switched capacitor network 14 is operative to generate differential I output signals $V_{OUT\_I}{}^+$, $V_{OUT\_I}{}^-$ and differential Q output signals $V_{OUT\_Q}{}^+$, $V_{OUT\_Q}{}^-$.

Figure 7:
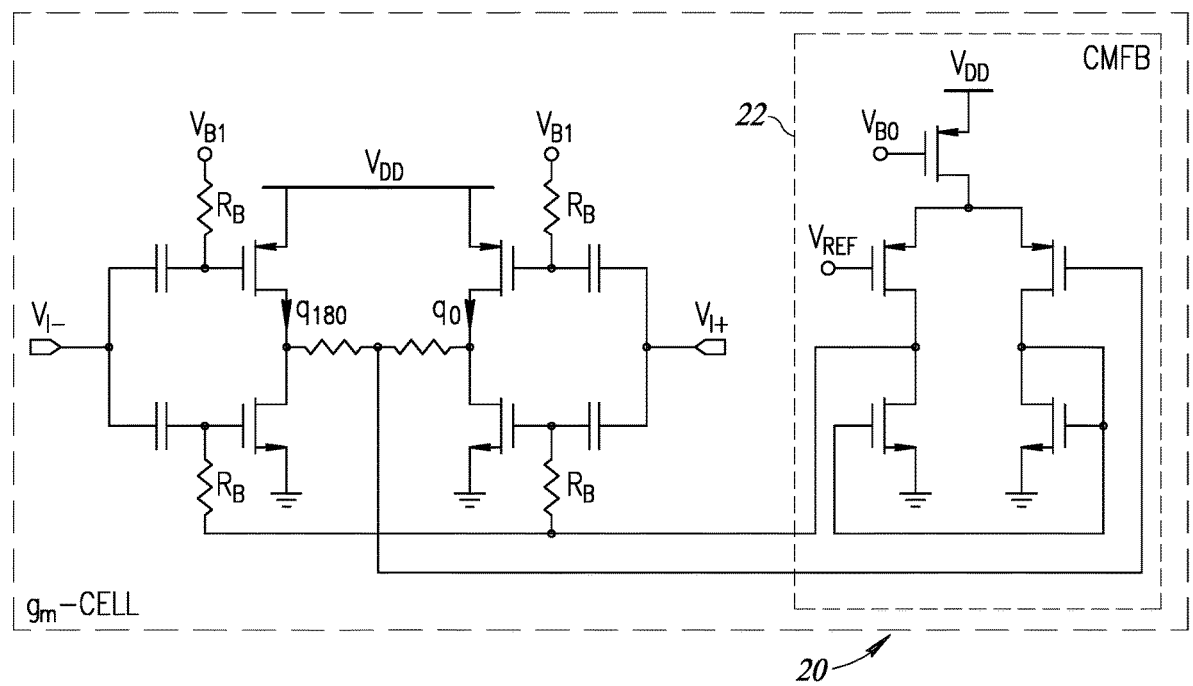
FIG. 7 is a schematic diagram illustrating an example $g_m$ cell in more detail.

A schematic diagram illustrating an example $g_m$ cell in more detail is shown in FIG. 7. The $g_m$ circuit, generally referenced 20, comprises continuous-time common-mode feedback (CMFB) circuit 22.

Figure 8:
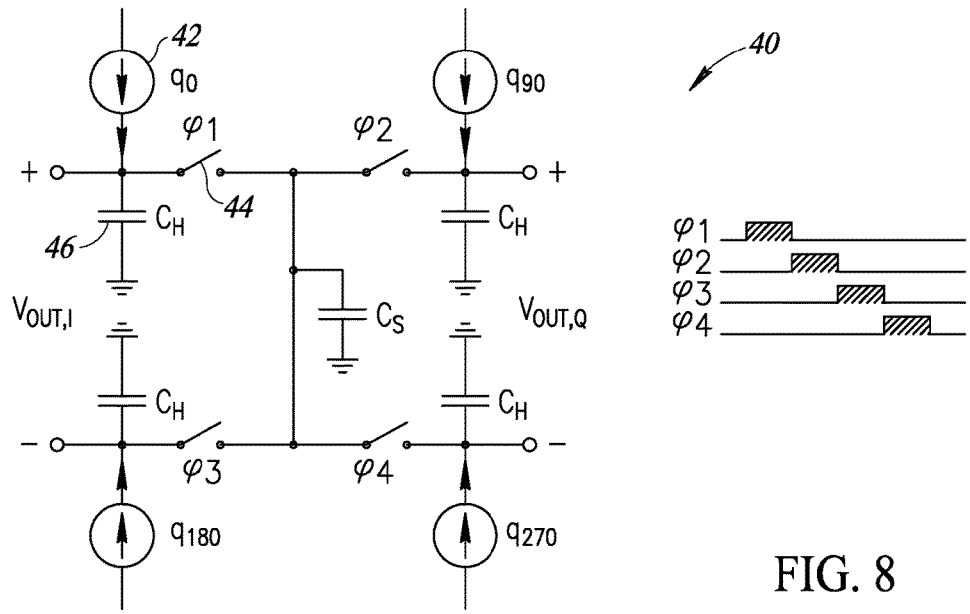
FIG. 8 is a schematic diagram illustrating a first example charge sharing BPF circuit having four clock phases.

A schematic diagram illustrating a first example first order charge sharing BPF circuit having four clock phases is shown in FIG. 8. The BPF circuit, generally referenced 40, comprises a plurality of input current sources 42 (q0, q90, q180, q270), switches 44, and history capacitors $C_H$ 46. Each history capacitor is associated with one of the switches. One leg of each switch is coupled to a sharing capacitor $C_S$.

In one embodiment, the first order band pass IIR filter 40 is constructed based on quadrature input charge packets, namely q0, q90, q270, and q180. The switches 44 are controlled by the four phase clock signals φ1 through φ4. During φ1, φ2, φ3, and φ4, charge packets are accumulated in their respective history capacitors $C_H$. Then at each phase, the charge is shared with previous charge packets by a sharing capacitor $C_S$.

In one embodiment, in order to achieve better filtering, the order of the filter can be increased by adding an additional phase to each of the four legs or paths, thus achieving a second order BPF. By increasing the order of filter by only one, the number of phases which is required is doubled (i.e. eight phases in total are now needed).

Figure 9:
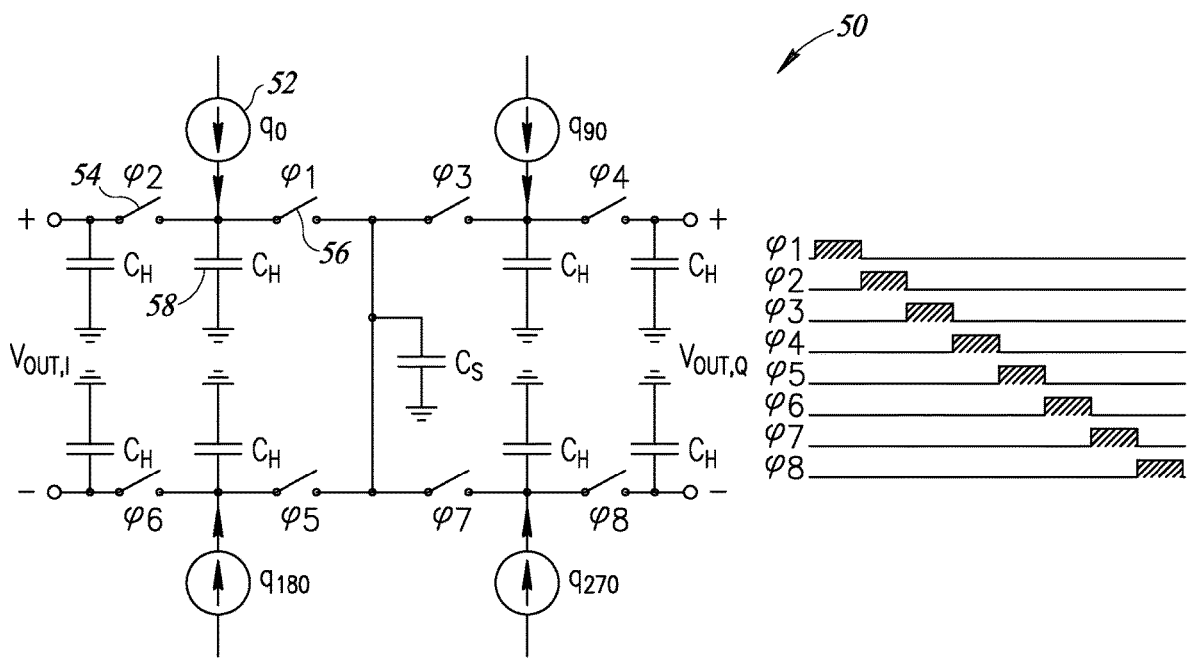
FIG. 9 is a schematic diagram illustrating a second example charge sharing BPF circuit having eight clock phases.

A schematic diagram illustrating a second example charge sharing BPF circuit having eight clock phases is shown in FIG. 9. The BPF filter circuit, generally referenced 50, comprises a plurality of input current sources 52 (q0, q90, q180, q270), switches 56, and history capacitors $C_H$ 58. One history capacitor is associated with each switch and all switches are coupled to a sharing capacitor $C_S$. An additional four switched history capacitors are provided, one for each of the four paths. The multiple clock phases shown φ1, φ2, φ3, φ4, φ5, φ6, φ7, and φ8 are coupled to respective switches as labeled. The multi-phase clocking sequence is such that charge is transferred in the direction from the sharing capacitor end of the circuit toward the outputs. Each switched history capacitor is assigned one of the clock phases with no clock phase reuse. The disadvantage of this BPF circuit is that eight, rather than four clock phases are required to improve the filter performance.

In one embodiment, a higher order BPF is achieved without requiring any increase in the number of phases. In this technique the clock phases output of the clock generator are reused in order to provide the higher order filtering.

Figure 10:
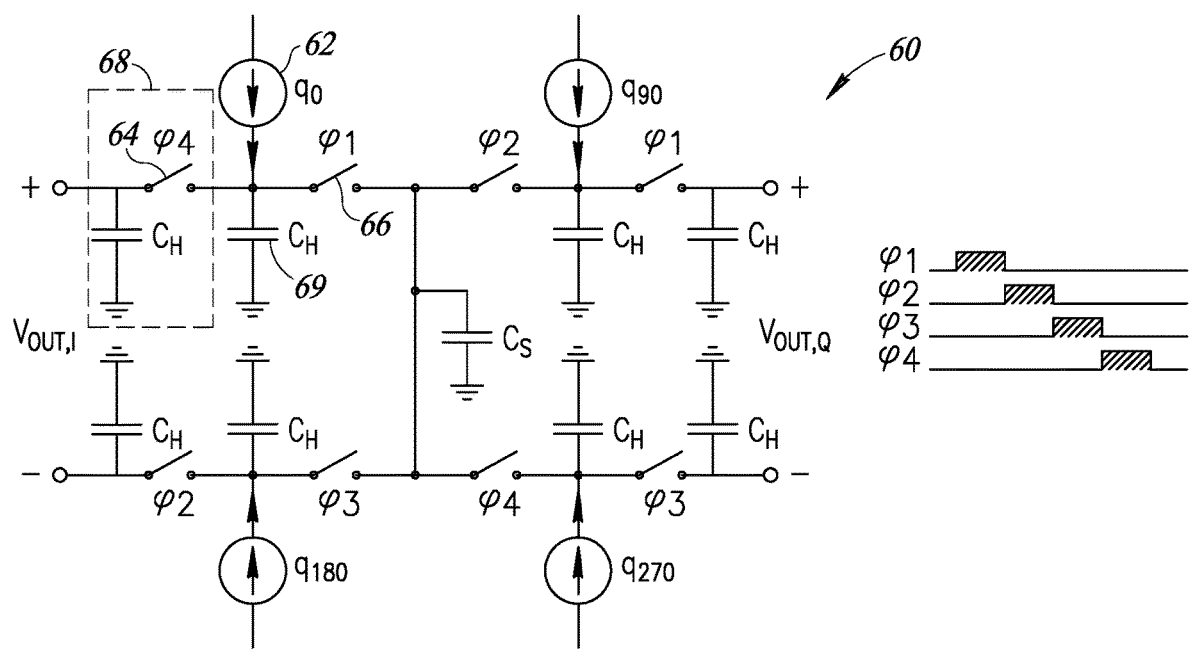
FIG. 10 is a schematic diagram illustrating a third example charge sharing BPF circuit having four clock phases incorporating clock phase reuse.

A schematic diagram illustrating a third example charge sharing BPF circuit having four clock phases with clock phase reuse is shown in FIG. 10. The BPF circuit, generally referenced 60, comprises a plurality of input current sources 62 (q0, q90, q180, q270), switches 66, history capacitors $C_H$ 69, and additional switched history capacitors 68 incorporating switches 64. Each history capacitor is associated with the first switch in each of the four legs coupled to a sharing capacitor $C_S$. Additional four switched history capacitors are provided, one for each of the four legs or paths. The multiple clock phases shown φ1, φ2, φ3, and φ4 are coupled to respective switches as labeled. The multi-phase clocking sequence is such that charge is transferred in the direction from the sharing capacitor end of the circuit toward the outputs. In this example, each clock phase is assigned to two switches thus reusing the clock phases. The advantage of this BPF circuit is that four, rather than eight clock phases are required to improve the filter performance.

Thus, a higher order BPF is achieved without any increase in the number of phases. The clock phases generated are reused to provide higher order and improved filtering. With reference to FIG. 10, during phases φ1 to φ4, the charge packets (i.e. denoted q0 to q4) are integrated by their respective history capacitors. Before φ1 is active in the second cycle, at φ4 of the first cycle, the previous charge of its history capacitor is shared with the second history capacitor. Then at the third cycle, the shared charge is shared again with the third history capacitor and eventually at the fourth cycle, the remaining charge is shared with the history capacitor at the output node. This new charge sharing happens during four cycles for each path leading to the higher order bandpass filter. By reusing the clock phases, without adding any extra phases which would substantially narrow the pulses, significantly better filtering is achieved and the quality factor of the filter is improved. This leads to sharper transition bands especially for close-in band blockers in 4G/5G and satellite receivers.

Figure 16:
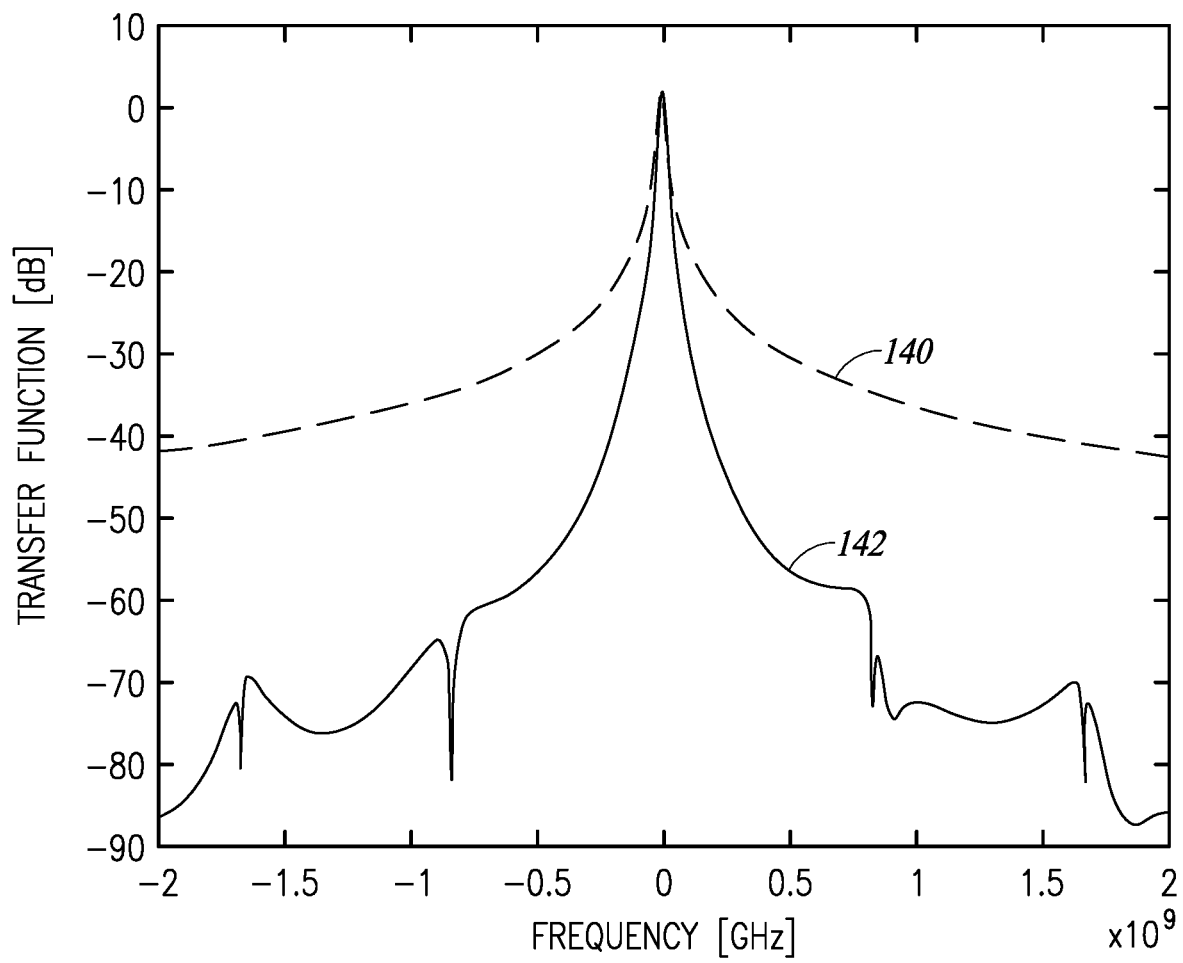
FIG. 16 is a diagram illustrating the transfer function of the IIR bandpass filter of the present invention versus a prior art bandpass filter.

A diagram illustrating the transfer function of the IIR bandpass filter of the present invention versus a prior art bandpass filter is shown in FIG. 16. The figure shows the simulated normalized frequency response of the bandpass filter of the present invention (trace 142) compared with that of the prior art architecture (trace 140). As shown, reusing the existing clock phases for the same total occupied silicon area (assuming the same capacitor density) improves the out of band rejection by more than 10 dB for close-in offsets (i.e. less than 15 MHz). In one embodiment, the BPF has been implemented in TSMC 28 nm CMOS technology. Both $C_S$ and $C_H$ are implemented by MoM capacitors. The filter operates at 1.05 V power supply voltage.

It is noted that the ability to be operate at a relatively high clock frequency, with high in-band and stop-band rejections, and bandwidth tuneability, make the BPF with clock reuse circuit architecture well suited for discrete time receivers, which are more and more finding applications such as 5G, satellite communication, and phased array for automotive radar.

Figure 11:
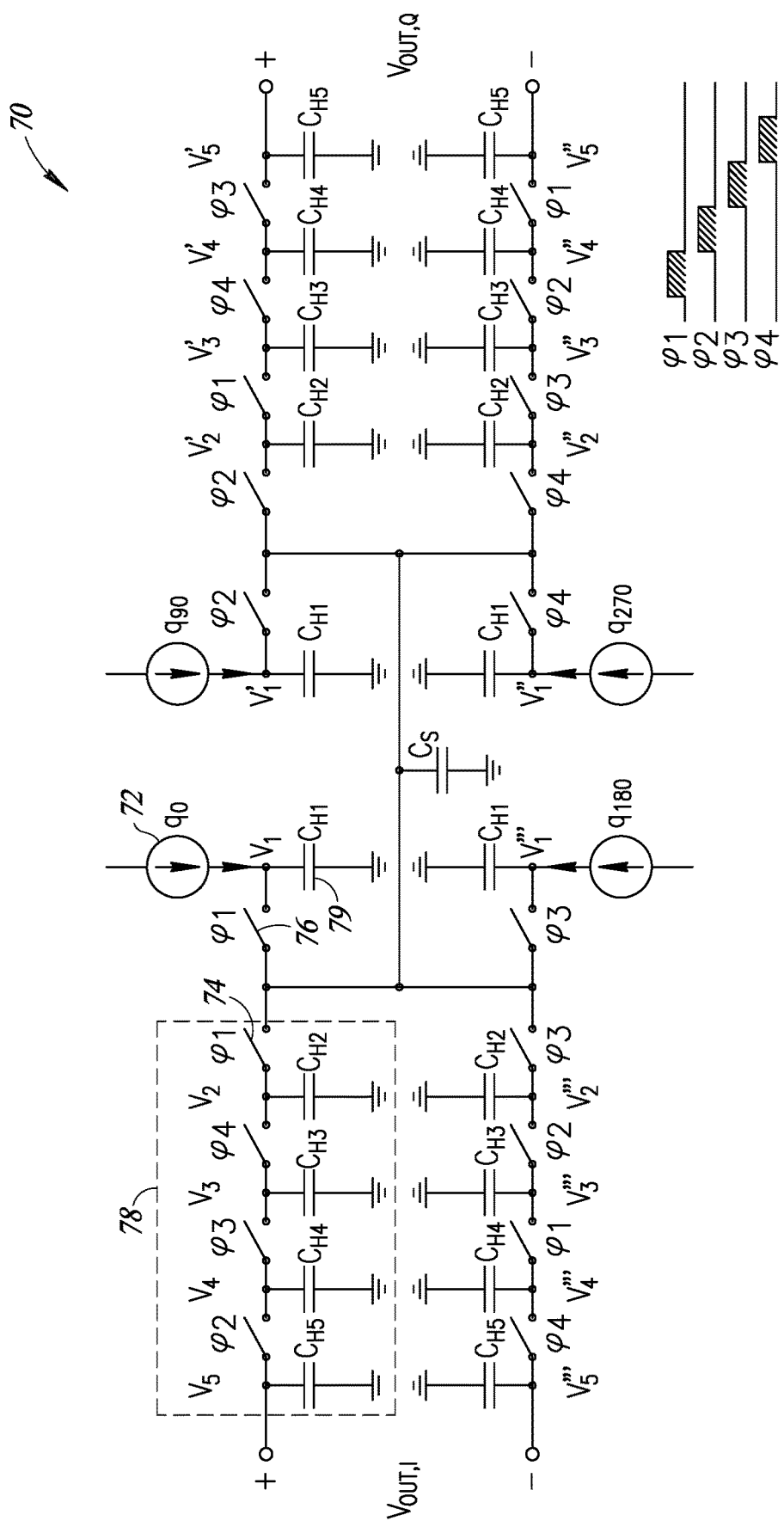
FIG. 11 is a schematic diagram illustrating a fourth example charge sharing BPF circuit having four clock phases incorporating clock phase reuse.

A schematic diagram illustrating a fourth example charge sharing BPF circuit having four clock phases is shown in FIG. 11. The BPF circuit, generally referenced 70, comprises a plurality of input current sources 72 (q0, q90, q180, q270), switches 76, history capacitors $C_{H1}$ 79, additional switched history capacitors $C_{H2}$, $C_{H3}$, $C_{H4}$, $C_{H5}$ incorporating switches 74. Each history capacitor $C_{H1}$ is associated with the first switch in each of the four legs coupled to the sharing capacitor $C_S$. In each branch or leg 78, an additional four switched history capacitors $C_{H2}$, $C_{H3}$, $C_{H4}$, $C_{H5}$ are provided coupled in sequential fashion. The multiple clock phases shown φ1, φ2, φ3, and φ4 are coupled to respective switches as labeled. The multi-phase clocking sequence is such that charge is transferred from $C_{H1}$ towards $C_{H5}$ the output. In this example, each clock phase is assigned to five switches thus reusing the clock phases. The advantage of this BPF circuit is that four, rather than sixteen or twenty clock phases are required to improve the performance of the filter.

In operation, during phases φ1 to φ4, the charge packets (i.e. denoted q0 to q4) are integrated by their respective history capacitors. Before φ1 is active in the second cycle, at φ4 of the first cycle, the previous charge of its history capacitor is shared with the second history capacitor. Then at the third cycle, the shared charge is shared again with the third history capacitor and eventually at the fourth cycle, the remaining charge is shared with the history capacitor at the output node thereby generating the differential I and Q outputs. Note that additional switched history capacitors can be added to each leg of the circuit to further improve the performance of the BPF.

Thus, in operation, during each multi-phase cycle of said filter one of the history capacitors $C_{H1}$ is connected to the sharing capacitor $C_S$. In addition, charge is shared between at least one switched history capacitor $C_{H2}$, $C_{H3}$, $C_{H4}$, $C_{H5}$ and its neighboring switched history capacitor within each capacitor array. Each clock phase is reused one or more times, where each clock phase is coupled to a plurality of switched history capacitors in the capacitor arrays 78. In addition, charge is shared between neighboring switched history capacitors within each capacitor array in a predetermined sequence so as to generate the quadrature output.

The basic quadrature (i.e. four outputs) $C_S$ BPF can be synthesized from the $4^{th}$ order DT IIR filter (with a single real output) by applying input charge packets q0, q90, q180, and q270 with a multiple of 90 degree phase shifts. During each phase of $\varphi 1$, $\varphi 2$, $\varphi 3$ and $\varphi 4$, four input charge packets are accumulated into their respective history capacitors $C_H$. At the end of each phase, the $C_S$ containing the previous packet is ready to be charge shared with $C_H$ containing the current input charge packet and the "history" charge. Therefore, in each phase, sharing capacitor $C_S$ removes a charge proportional to $C_S/(C_H+C_S)$ from each $C_H$ and then delivers it to the next $C_H$. The four quadrature outputs are read out at the sampling rate of $f_S=1/T_S=f_{LO}$.

The transfer function analysis of the BPF of FIG. 11 can be derived as follows. Initially, consider only the first path. Note that the voltage nodes are labeled $V_1$, $V_2$, $V_3$, $V_4$, $V_5$ to designate the voltage on each history capacitor $C_{H1}$, $C_{H2}$, $C_{H3}$, $C_{H4}$, $C_{H5}$ respectively, for the q0 leg. Similarly, voltage nodes labeled $V_1'$, $V_2'$, $V_3'$, $V_4'$, $V_5'$ denote the voltage on each history capacitor $C_{H1}$, $C_{H2}$, $C_{H3}$, $C_{H4}$, $C_{H5}$, respectively, for the q90 leg. Likewise, voltage nodes labeled $V_1''$, $V''$, $V_3''$, $V_4''$, $V_5''$, refer to the voltage on each history capacitor $C_{H1}$, $C_{H2}$, $C_{H3}$, $C_{H4}$, $C_{H5}$ respectively, for the q180 leg. Finally, voltage nodes labeled $V_1'''$, $V_2'''$, $V_3'''$, $V_4'''$, $V_5'''$, as designate the voltage on each history capacitor $C_{H1}$, $C_{H2}$, $C_{H3}$, $C_{H4}$, $C_{H5}$ respectively, for the q270 leg.

$$@\phi_2 : V_5[n] = \frac{C_{H5}}{C_{H5}+C_{H4}} V_5[n-3] + \frac{C_{H4}}{C_{H5}+C_{H4}} V_4[n-1] \quad (3)$$

$$@\phi_3 : V_4[n-1] = \frac{C_{H4}}{C_{H4}+C_{H3}} V_4[n-1-2] + \frac{C_{H3}}{C_{H4}+C_{H3}} V_3[n-2]$$

$$@\phi_4 : V_3[n-2] = \frac{C_{H3}}{C_{H2}+C_{H3}} V_3[n-2-1] + \frac{C_{H2}}{C_{H2}+C_{H3}} V_2[n-3]$$

$$@\phi_1 : V_2[n-3] =$$
$$\frac{C_{H2}}{C_{H2}+C_{H1}+C_S} V_2[n-3-1] + \frac{C_{H1}}{C_{H2}+C_{H1}+C_S} V_1[n-4] +$$
$$\frac{C_S}{C_{H1}+C_{H2}+C_S} V_1'''[n-3] + \frac{1}{C_{H1}+C_{H2}+C_S} q_0[n-3]$$

By applying a Fourier transfer, we obtain:

$$V_5(z) = \alpha_1 z^{-3} V_5(z) + (1-\alpha_1) z^{-1} V_4(z)$$

$$V_4(z) z^{-1} = \alpha_2 z^{-3} V_4(z) + (1-\alpha_2) z^{-2} V_3(z)$$

$$V_3(z) z^{-2} = \alpha_3 z^{-3} V_3(z) + (1-\alpha_3) z^{-3} V_2(z) \quad (4)$$

and $$V_2(z) z^{-3} = \alpha_4 z^{-4} V_2(z) + (1-\alpha_4) z^{-3} V_1'''(z) + \beta z^{-3} Q_0 \quad (5)$$

where $\alpha_1$, $\alpha_2$, $\alpha_3$, $\alpha_4$, and $\beta$ are defined by:

$$\alpha_1 = \frac{C_{H5}}{C_{H5}+C_{H4}} \quad (6)$$

$$\alpha_2 = \frac{C_{H4}}{C_{H4}+C_{H3}}$$

$$\alpha_3 = \frac{C_{H3}}{C_{H3}+C_{H2}}$$

$$\alpha_4 = \frac{C_{H2}+C_{H1}}{C_{H2}+C_{H1}+C_S}$$

$$\beta = \frac{1}{C_{H2}+C_{H1}+C_S}$$

By simplifying Equation (4), we obtain:

$$V_1 = V_2 = \frac{(1-\alpha_1 z^{-3})(1-\alpha_2 z^{-2})(1-\alpha_3 z^{-1})}{(1-\alpha_1)(1-\alpha_2)(1-\alpha_3) z^{-3}} V_5 \quad (7)$$

In accordance with FIG. 11, at $\varphi 1$, $V_1(z)=V_2(z)$. Then using Equation 5 we obtain the following equations for all four paths:

$$V_1(z) z^{-3} = \alpha_4 z^{-4} V_1(z) + (1-\alpha_4) z^{-4} V_1'''(z) + \beta z^{-3} Q_0$$

$$V_1'(z) z^{-3} = \alpha_4 z^{-4} V_1'(z) + (1-\alpha_4) z^{-4} V_1(z) + \beta z^{-3} Q_0'$$

$$V_1''(z) z^{-3} = \alpha_4 z^{-4} V_1''(z) + (1-\alpha_4) z^{-4} V_1'(z) + \beta z^{-3} Q_0''$$

$$V_1'''(z) z^{-3} = \alpha_4 z^{-4} V_1'''(z) + (1-\alpha_4) z^{-4} V_1''(z) + \beta z^{-3} Q_0''' \quad (8)$$

In the BPF of the present invention, the following is known:

$$Q_0 + e^{j\frac{\pi}{2}} Q_0' + e^{j2\frac{\pi}{2}} Q_0'' + e^{j3\frac{\pi}{2}} Q_0''' = Q_c \quad (9)$$

$$V_1 + e^{j\frac{\pi}{2}} V_1' + e^{j2\frac{\pi}{2}} V_1'' + e^{j3\frac{\pi}{2}} V_1''' = V_{1c}$$

Modification of Equation 8 yields the following $$V_1 z^{-3}(1-\alpha_4 z^{-1}) = \beta z^{-3} Q_0 + (1-\alpha_4) z^{-4} V_1''' \quad (10)$$

$$e^{j\frac{\pi}{2}} \times (V_1' z^{-3}(1-\alpha_4 z^{-1}) = \beta z^{-3} Q_0' + (1-\alpha_4) z^{-4} V_1)$$

$$e^{2j\frac{\pi}{2}} \times (V_1'' z^{-3}(1-\alpha_4 z^{-1}) = \beta z^{-3} Q_0'' + (1-\alpha_4) z^{-4} V_1')$$

$$e^{3j\frac{\pi}{2}} \times (V_1''' z^{-3}(1-\alpha_4 z^{-1}) = \beta z^{-3} Q_0''' + (1-\alpha_4) z^{-4} V_1'')$$

Combining the left and right hand sides of Equation 10 we obtain $$V_{1c} z^{-3}(1-\alpha_4 z^{-1} - (1-\alpha_4) z^{-1} e^{j\frac{\pi}{2}}) = \beta z^{-3} Q_c \quad (11)$$

Intuitively, we know $$V_{1c} = \frac{(1-\alpha_1 z^{-3})(1-\alpha_2 z^{-2})(1-\alpha_3 z^{-1})}{(1-\alpha_1)(1-\alpha_2)(1-\alpha_3) z^{-3}} V_{5c} \quad (12)$$

Inserting Equation 12 into Equation 11 yields the transfer function of the BPF of the present invention calculated as follows $$H_c(z) = \frac{V_{Sc}}{Q_c} = \frac{(1-\alpha_1)(1-\alpha_2)(1-\alpha_3)\beta z^{-3}}{(1-\alpha_1 z^{-3})(1-\alpha_2 z^{-2})(1-\alpha_3 z^{-1})} \quad (13)$$
$$\left[1 - \alpha_4 z^{-1} - (1-\alpha_4)z^{-1}e^{j\frac{\pi}{2}}\right]$$

A generalized transfer function of the BPF of the present invention for M elements with phase shift of φ and considering $\alpha_1 = \alpha_2 = \ldots = \alpha_{m-1} = \alpha$ can be expressed as follows:

$$H_{m,\varphi}(z) = \frac{\beta(1-\alpha)^{m-1}z^{-(m-1)}}{(1-\alpha z^{-(m-1)})(1-\alpha z^{-(m-2)})\ldots} \quad (14)$$
$$(1-\alpha z^{-1})\left[1 - \alpha_4 z^{-1} - (1-\alpha_4)z^{-1}e^{j\frac{\pi}{2}}\right]$$

Note that the transfer function of Equation 13 can be compared to the transfer function of a non-clock reuse CS BPF (e.g., FIG. 8) as calculated and shown below $$H(z) = \frac{V_c}{Q_c} = \frac{1/(C_H + C_S)}{[(1-(C_H/(C_H+C_S)z^{-1})-} \quad (15)$$
$$((C_S/(C_H+C_S))e^{j\pi/2}z^{-1}}$$

Figure 19:
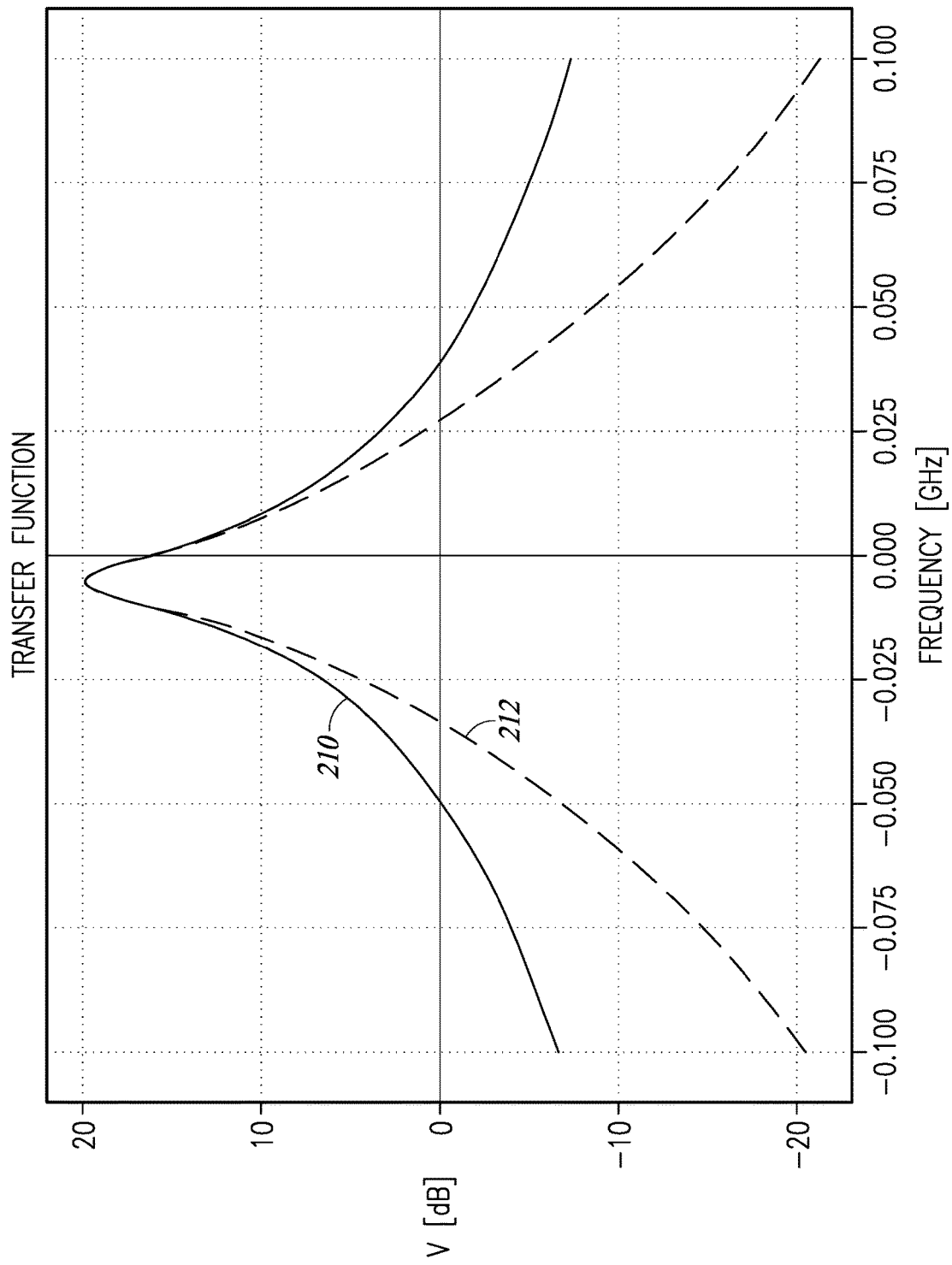
FIG. 19 is a diagram illustrating a comparison of the transfer functions of the IIR bandpass filter of the present invention and that of FIG. 8.

A diagram illustrating a comparison of the transfer functions of the IIR bandpass filters of the present invention and that of FIG. 8 is shown in FIG. 19. The simulation results for the calculated transfer function as expressed in Equation 13 is shown as trace 212. This is compared to the transfer function of the BPF of FIG. 8 which is indicated as trace 210.

Figure 12:
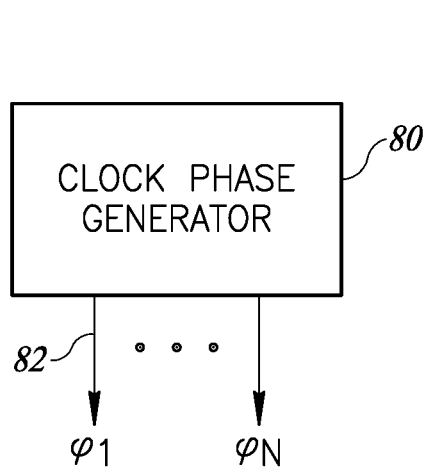
FIG. 12 is a diagram illustrating an example clock phase generator circuit.

A diagram illustrating an example clock phase generator circuit is shown in FIG. 12. As described supra, the clock phase generator 80 is operative to generate a plurality of clock phase pulses 82 labeled φ1 through φN used to control the switched history capacitors in each leg of the filter. In the example embodiment described herein, N=4. It is appreciated, however, that other values of N may be implemented as well.

Figure 13:
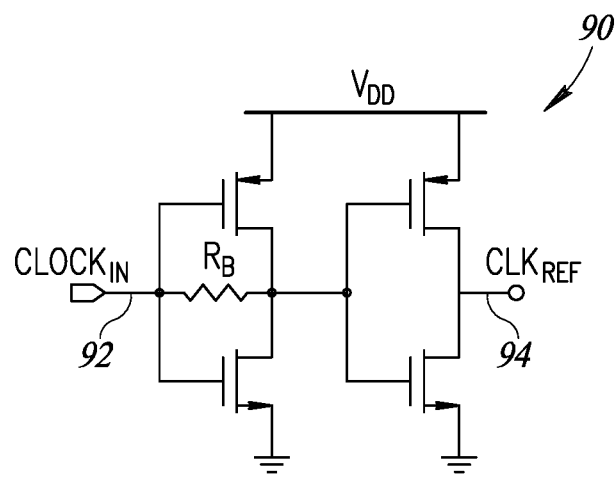
FIG. 13 is a diagram illustrating an example reference clock generator circuit.

A diagram illustrating an example reference clock generator circuit is shown in FIG. 13. The clock generator circuit 90 is operative to receive a sine wave input clock signal 92 and generate a square wave reference clock $CLK_{REF}$ output signal 94 therefrom.

Figure 14:
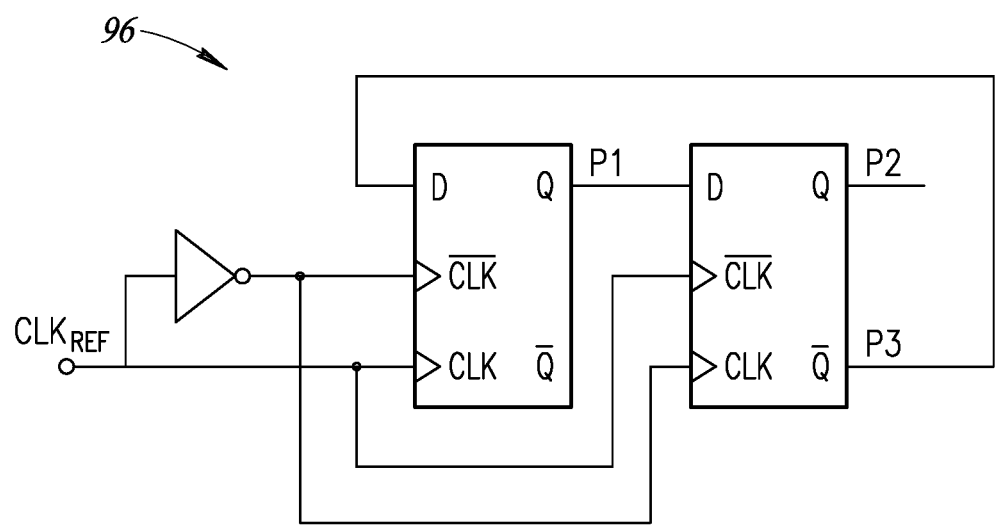
FIG. 14 is a diagram illustrating an example clock phase generator circuit.

A diagram illustrating an example clock phase generator circuit is shown in FIG. 14. The phase generator circuit, generally referenced 96, comprises a plurality of flip flops connected in daisy chain fashion. In an example embodiment, the phase generator comprises two phase registers connected back to back to each other and operative to generate multiple phase signals, i.e. P1, P2, P3. The output of the last flip flop stage, Q bar, is fed back to the input of the first stage. Thus, this flip flop does not require a reset signal. By using nonoverlapping circuits, the required clock signals are aligned and connected to the gate of the switches. The output of the filter is input to a buffer (not shown) to generate an output $V_{OUT}$ signal which can drive 50 ohm downstream circuitry, for example.

Figure 15:
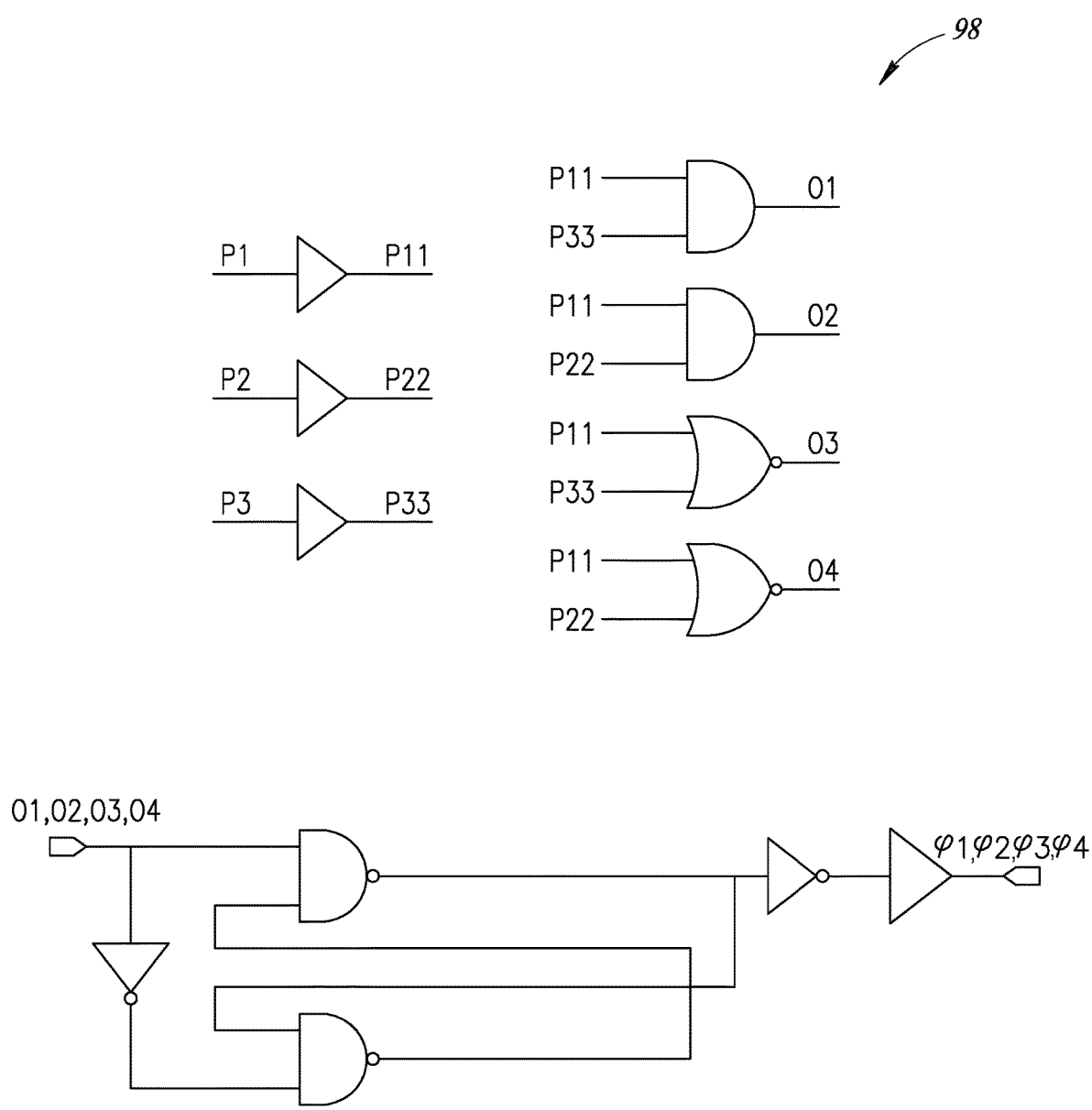
FIG. 15 is a diagram illustrating an example clock waveform generator circuit.

A diagram illustrating an example clock waveform generator circuit is shown in FIG. 15. The nonoverlapping circuit, generally referenced 98, comprises the logic elements for generating the multiple clock phase signals φ1, φ2, φ3, φ4 that are applied to the appropriate switches in each filter leg. The resultant output waveforms are shown in FIG. 11.

Figure 17:
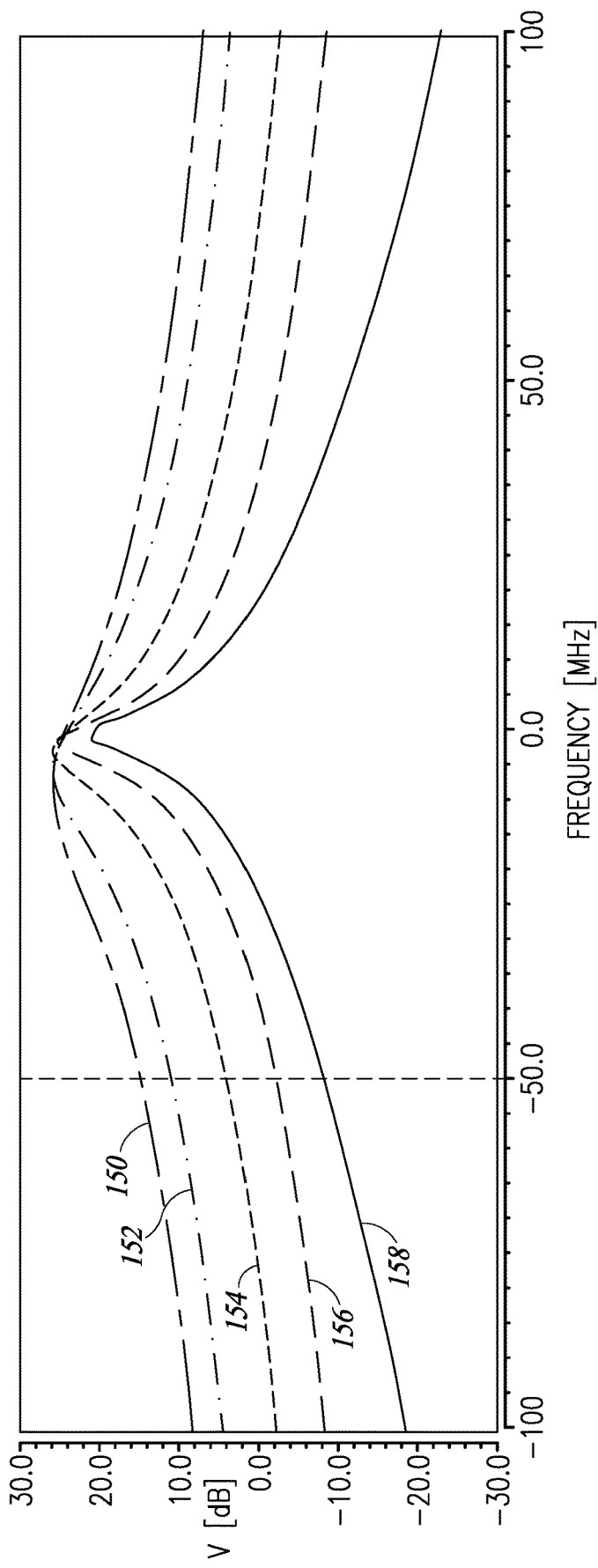
FIG. 17 is a diagram illustrating the transfer function of the IIR bandpass filter of the present invention versus several bandpass filters with different sized history capacitors.

A diagram illustrating the transfer function of the IIR bandpass filter of FIG. 11 compared to several bandpass filters with different sized history capacitors is shown in FIG. 17. Trace 150 represents the transfer function for a bandpass filter of FIG. 8 with $C_H$=4.5 pF, $C_S$=1 pF. Trace 152 represents the transfer function for a bandpass filter of FIG. 8 with $C_H$=7 pF, $C_S$=1 pF. Trace 154 represents the transfer function for a bandpass filter of FIG. 8 with $C_H$=15 pF, $C_S$=1 pF. Trace 156 represents the transfer function for a bandpass filter of FIG. 8 with $C_H$=30 pF, $C_S$=1 pF. Trace 158 represents the transfer function for the clock phase reuse bandpass filter of FIG. 11 with total $C_H$=4.5 pF, where $C_H$=$C_{H1}$+$C_{H2}$+$C_{H3}$+$C_{H4}$+$C_{H5}$, $C_S$=1 pF. Note that significantly better filter performance is achieved (better than the filter using large sized history capacitors of 30 pF) using the same small history capacitor $C_H$ size of trace 150 by the use of clock phase reuse techniques in accordance with the present invention.

Figure 18:
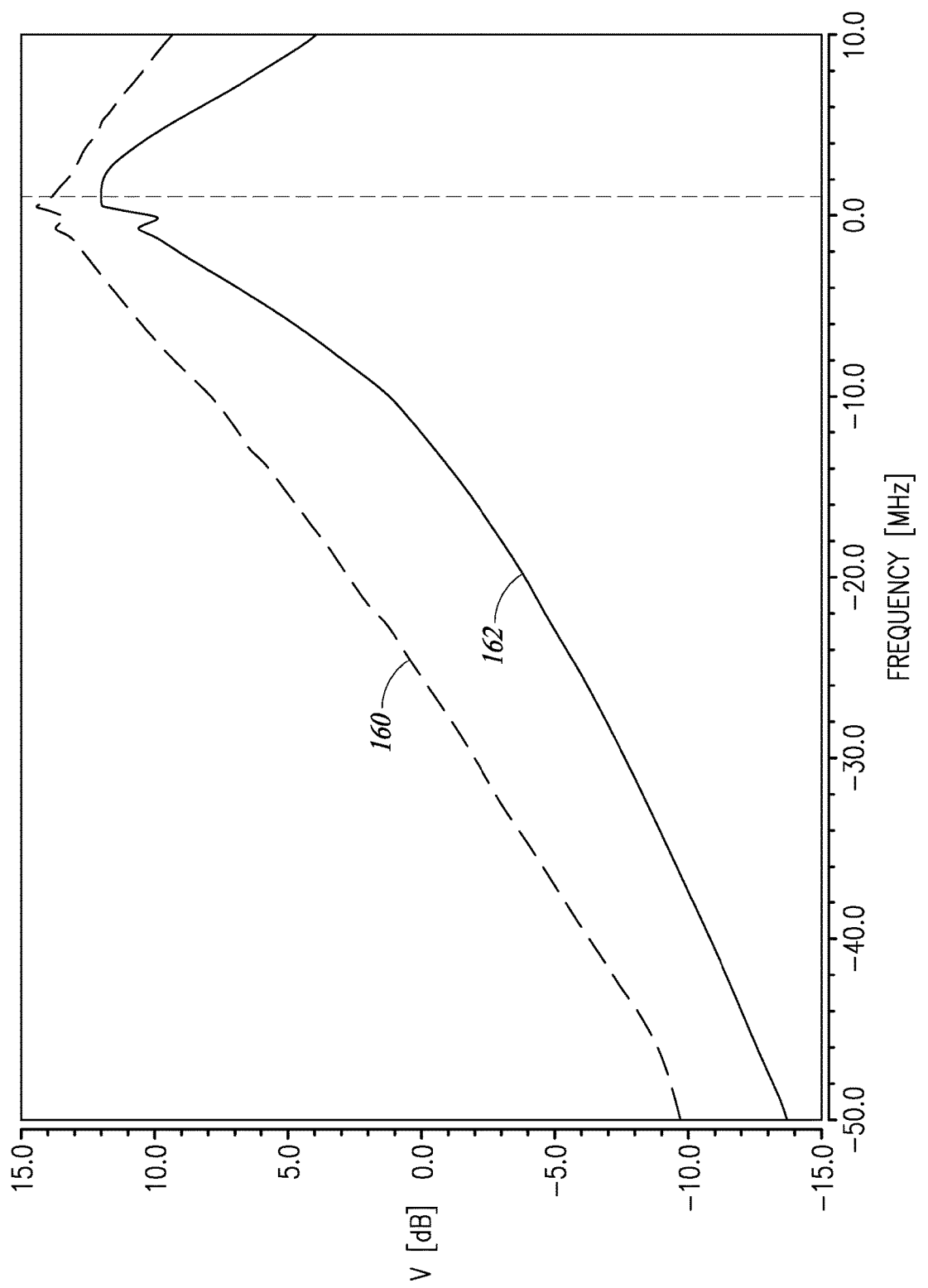
FIG. 18 is a diagram illustrating a comparison of the transfer functions of the IIR bandpass filters of FIGS. 9 and 10.

A diagram illustrating a comparison of the transfer functions of the IIR bandpass filters of FIGS. 9 and 10 is shown in FIG. 18. It is noted that the structure of the charge sharing bandpass filters of FIG. 9 is identical to that of FIG. 10 with the only difference being the use of eight clock phases (i.e. single clock phase use) in the filter of FIG. 9 versus four clock phases (i.e. with multiple clock phase reuse) in the filter of FIG. 10. The transfer function of the filter of FIG. 9 is represented by trace 160 while that of the filter of FIG. 10 is represented by trace 162. Thus, given the same circuit architecture, the use of clock phase reuse techniques provided significant improvement in filter performance.

In another embodiment, a superheterodyne receiver is provided that utilizes the clock phase reuse techniques of the present invention. In one embodiment, an integrated superheterodyne RX is operative to filter the blockers through an N-path filter, as opposed to a discrete time filtering approach. An image folding issue, however, is not addressed by this architecture. In another embodiment, image folding issues are solved through use of a discrete-time (DT) charge-sharing filtering technique. The interferer blockers are filtered through a feedback based high-Q RF band pass filter (BPF). The architecture is process scalable and highly reconfigurable.

Figure 20:
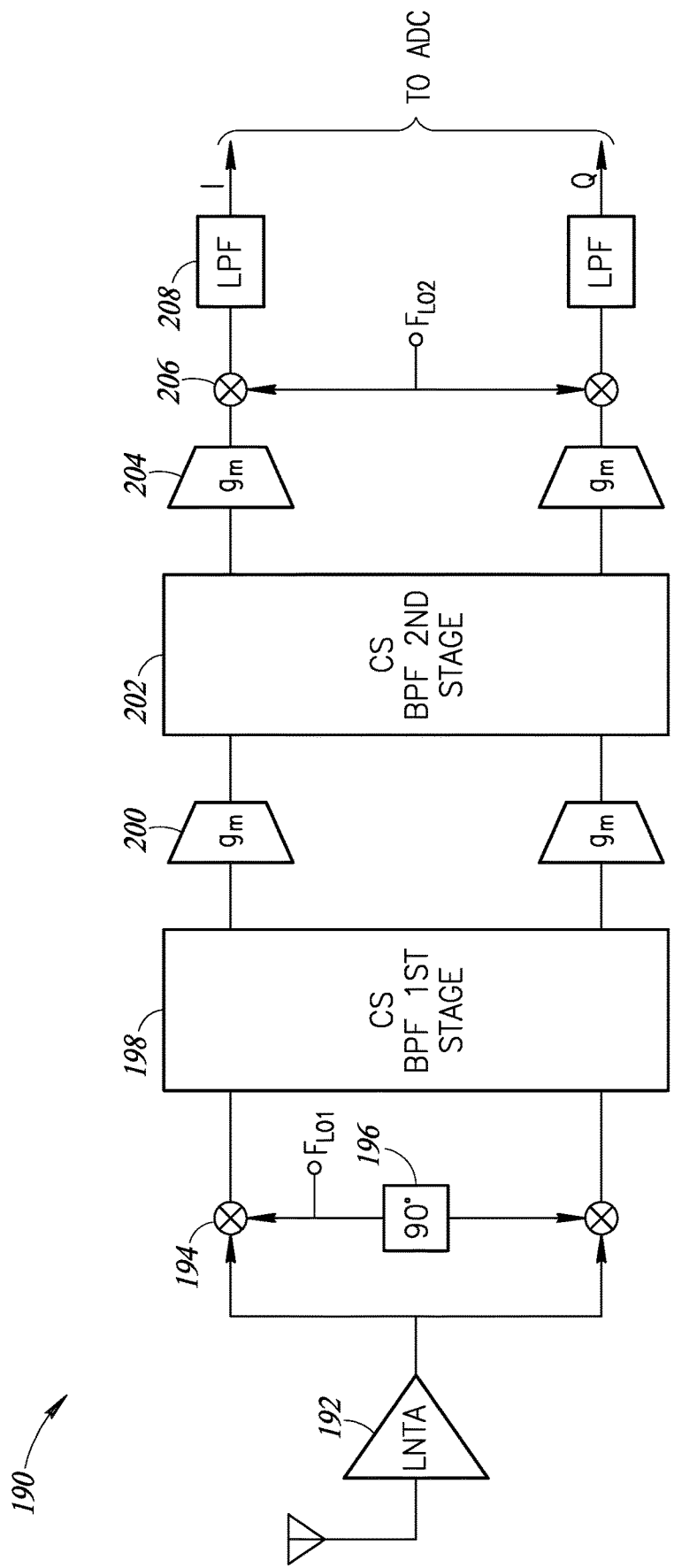
FIG. 20 is a block diagram illustrating an example RF receiver incorporating the discrete time, charge sharing IIR bandpass filter of the present invention.

A block diagram illustrating an example RF receiver incorporating the discrete time, charge sharing IIR bandpass filter of the present invention is shown in FIG. 20. The filter, generally referenced 190, comprises an antenna, low noise transconductance amplifier (LNTA) 192, passive current mode mixers 194 coupled to a first local oscillator signal $f_{LO1}$, 90 degree phase shifter 196, a 1$^{st}$ stage charge sharing bandpass filter 198, $g_m$-cell stages 200, a 2$^{nd}$ stage charge sharing bandpass filter 202, $g_m$-cell stages 204, baseband mixers 206 coupled to a second local oscillator signal $f_{LO2}$, and low pass filters (LPFs) 208 which generate I and Q outputs subsequently input to an analog to digital converter (ADC).

First, the RF input signal is converted to a current using an inverter based stage followed by a 25% passive mixer clocked at $f_{LO}$. The complex output current of the mixer requires a complex low-impedance node for blockers to eliminate the saturation of the $g_m$ output. As shown, the blockers are attenuated because of the complex high-Q BPF while the first complex full-rate wideband IQ charge sharing BPF, after the mixer stage, rejects other image components, including those components at $-f_{IF}$. The filtered complex signals go through a similar wideband IQ filters for more attenuation of the images and amplification of the wanted signal.

As an application example of such a BPF, the feedback based superheterodyne RX utilizing a charge sharing (CS) technique was proposed in. Also, a complete fully integrated superheterodyne RX using the CS technique and a BB filtering was proposed. The folding due to the lower sampling frequency of the BB filters is also of no real concern as it is protected by the preceding high-IF CS filters.

The RF signal is converted to current $I_{RF}$ via a low-noise transconductance amplifier (LNTA). Then, $I_{RF}$ is downconverted to an intermediate frequency $f_{IF}$ current $I_{IF}$ by a passive current mode mixer comprising commutating switches clocked at $f_{LO}$ rate with rail-to-rail 25% duty-cycle. The $f_{IF}=|f_{LO}-f_{RF}|$ frequency could be in the 1 to 100 MHz range. To avoid the unnecessary increase in power of IF circuitry, however, $f_{IF}$ should be placed just beyond the flicker noise corner of the devices comprising the RX circuitry. Mixers driven by the 25% duty-cycle clocks have a higher conversion gain from RF to IF and also introduce less flicker noise compared to counterparts driven by the 50% duty-cycle clock. Hence, this justifies our choice of the double-balanced mixer driven by the 25% clock.

The downconverted $I_{IF}$ current flows into a complex I/Q CS BPF. Multiple unit filters of $1^{st}$ order could be cascaded to obtain a high-Q BPF centered at $f_{IF}$. The filter of the present invention provides enhanced receiver selectivity and rejects unwanted blockers and images inherent to the high-IF architecture.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

The corresponding structures, materials, acts and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application and to enable others of ordinary skill in the art to understand the invention for various embodiments with various modifications as are suited to the particular use contemplated.

What is claimed is:

1. A discrete time bandpass filter, comprising:
   a quadrature input node for receiving a complex input signal;
   a plurality of first switched history capacitors ($C_{H1}$), each first switched history capacitor associated with a different portion of said quadrature input node;
   a sharing capacitor ($C_S$) coupled to said plurality of first switched history capacitors and operative to cyclically share charge therewith;
   a plurality of output capacitor arrays, each output capacitor array coupled to said sharing capacitor and including one or more second switched history capacitors; and
   a clock generator operative to generate multiple clock phases, wherein during each multi-phase cycle of said filter, each first switched history capacitor is individually connected to said sharing capacitor such that one first switched history capacitor is connected to said sharing capacitor during each clock phase.

2. The discrete time bandpass filter according to claim 1, wherein performance of said filter is improved without adding additional clock phases by the assignment of the same clock phase to multiple second switched history capacitors which increases an order of said discrete time bandpass filter.

3. The discrete time bandpass filter according to claim 1, wherein said multiple clock phases are reused providing an increase in filter performance without requiring additional clock phases.

4. The discrete time bandpass filter according to claim 1, wherein the second switched history capacitors in each capacitor array are coupled to said multiple clock phases causing them to be switched in accordance with a predetermined sequence.

5. The discrete time bandpass filter according to claim 1, wherein each clock phase is coupled to multiple second switched history capacitors in said plurality of capacitor arrays.

6. The discrete time bandpass filter according to claim 1, wherein the charge of each said first switched history capacitor is shared among the second switched history capacitors within an output capacitor array associated therewith.

7. The discrete time bandpass filter according to claim 1, wherein said multiple clock phases are reused whereby no new clocks are generating for said plurality of output capacitor arrays.

8. A discrete time bandpass filter, comprising:
   a quadrature input node for receiving a complex input signal;
   a plurality of first switched history capacitors ($CH_1$), each first switched history capacitor associated with a different element of said quadrature input node;
   a sharing capacitor ($C_S$) coupled to said plurality of first switched history capacitors and operative to cyclically share charge therewith;
   a plurality of capacitor arrays, each output capacitor array coupled to a respective first switched history capacitor and including one or more second switched history capacitors;
   a clock generator operative to generate a plurality of clock phases;
   wherein during each multi-phase cycle of said filter:
      a single first switched history capacitor is connected to said sharing capacitor;
      charge is shared from at least one second switched history capacitor to a neighboring second switched history capacitor in each capacitor array;
      multiple second switched history capacitors in said plurality of output capacitor arrays share the same clock phase; and wherein charge is shared between neighboring second switched history capacitors within each capacitor array in a predetermined sequence to generate a quadrature output thereby.

9. The discrete time bandpass filter according to claim 8, wherein performance of said filter is improved without requiring additional clock phases by the assignment of the same clock phase to multiple second switched history capacitors which increases an order of said discrete time bandpass filter.

10. The discrete time bandpass filter according to claim 8, wherein said multiple clock phases are reused multiple times providing an increase in filter performance without requiring additional clock phases.

11. The discrete time bandpass filter according to claim 8, wherein the second switched history capacitors in each capacitor array are coupled to said multiple clock phases causing them to be switched in accordance with a predetermined sequence.

12. The discrete time bandpass filter according to claim 8, wherein multiple second switched history capacitors in said plurality of capacitor arrays share the same clock phase.

13. A discrete time bandpass filter method, the method comprising:
receiving a complex input signal at a quadrature input node;
providing a plurality of first switched history capacitors ($C_{H1}$), each first switched history capacitor associated with a different element of said quadrature input node;
cyclically sharing charge between a sharing capacitor ($C_S$) and said plurality of first switched history capacitors;
providing a plurality of capacitor arrays, each output capacitor array coupled to a respective first switched history capacitor and including one or more second switched history capacitors;
generating a plurality of clock phases;
wherein during each multi-phase cycle of said filter:
connecting one of said first switched history capacitors to said sharing capacitor;
sharing charge between at least one second switched history capacitor and a neighboring second switched history capacitor in each capacitor array;
reusing each clock phase one or more times, multiple second switched history capacitors in said plurality of output capacitor arrays sharing the same clock phase; and
sharing charge between neighboring second switched history capacitors within each capacitor array in a predetermined sequence to generate a quadrature output thereby.

14. The method according to claim 13, wherein said multiple clock phases are reused multiple times providing an increase in filter performance without requiring additional clock phases.

15. The method according to claim 13, wherein the second switched history capacitors in each capacitor array are coupled to said multiple clock phases causing them to be switched in accordance with a predetermined sequence.

16. The method according to claim 13, wherein multiple second switched history capacitors in said plurality of capacitor arrays share the same clock phase.

* * * * *